US010268380B2

(12) United States Patent
Arelakis et al.

(10) Patent No.: US 10,268,380 B2
(45) Date of Patent: Apr. 23, 2019

(54) METHODS, DEVICES AND SYSTEMS FOR SEMANTIC-VALUE DATA COMPRESSION AND DECOMPRESSION

(71) Applicant: Zeropoint Technologies AB, Göteborg (SE)

(72) Inventors: Angelos Arelakis, Göteborg (SE); Per Stenström, Torslanda (SE)

(73) Assignee: ZEROPOINT TECHNOLOGIES AB, Gothenburg (SE)

( * ) Notice: Subject to any disclaimer, the term of this patent is extended or adjusted under 35 U.S.C. 154(b) by 0 days.

(21) Appl. No.: 15/575,072

(22) PCT Filed: May 20, 2016

(86) PCT No.: PCT/SE2016/050463
§ 371 (c)(1),
(2) Date: Nov. 17, 2017

(87) PCT Pub. No.: WO2016/186564
PCT Pub. Date: Nov. 24, 2016

(65) Prior Publication Data
US 2018/0143770 A1 May 24, 2018

(30) Foreign Application Priority Data
May 21, 2015 (SE) ...................................... 1550644

(51) Int. Cl.
*H03M 5/00* (2006.01)
*G06F 3/06* (2006.01)
*H03M 7/30* (2006.01)

(52) U.S. Cl.
CPC ............ *G06F 3/0608* (2013.01); *H03M 7/30* (2013.01); *H03M 7/3071* (2013.01); *H03M 7/3079* (2013.01); *H03M 7/6088* (2013.01)

(58) Field of Classification Search
CPC ............ H03M 7/3079; H03M 7/6088; H03M 7/3071; H03M 7/30; G06F 3/0608; G06F 3/06

(Continued)

(56) References Cited

U.S. PATENT DOCUMENTS 8,300,823 B2 * 10/2012 Bojinov ................ G06F 3/0608 380/269
8,898,117 B2 * 11/2014 Voll ...................... G06F 3/0608 707/687

(Continued)

FOREIGN PATENT DOCUMENTS

WO WO-2011/033381 A1 3/2011

OTHER PUBLICATIONS

Arelakis, A., et al. "A case for a value-aware cache", IEEE Computer Architecture Letters, vol. 13, No. 1, pp. 1-4, Jan. 21, 2014; abstract; Sections 2 and 5.

(Continued)

*Primary Examiner* — Jean B Jeanglaude
(74) *Attorney, Agent, or Firm* — Ballard Spahr LLP

(57) ABSTRACT

Methods, devices and systems enhance compression and decompression of data values when they comprise a plurality of semantically meaningful data fields. Compression is sometimes not applied to each data value as a whole, but instead to at least one of the semantically meaningful data fields of each data value, and in isolation from the other ones. Data fields can be organized that share the same semantic meaning together to accelerate compression and decompression as multiple compressors and decompressors can be used in parallel. A system can be used where methods and devices are tailored to perform compression and decompression of the semantically meaningful data fields of floating-point numbers after first partitioning further at least one of said data fields into two or a plurality of sub-fields to increase the degree of value locality and improve compressibility of floating-point values.

39 Claims, 23 Drawing Sheets

(58) Field of Classification Search
USPC .................................................. 341/50, 51, 55
See application file for complete search history.

(56) References Cited

U.S. PATENT DOCUMENTS

| | | | | |
|---|---|---|---|---|
| 2003/0130855 A1* | 7/2003 | Babu | ...................... | H03M 7/30 |
| | | | | 704/500 |
| 2009/0245382 A1 | 10/2009 | Ekman | | |
| 2010/0058002 A1* | 3/2010 | Voll | ...................... | G06F 3/0608 |
| | | | | 711/154 |
| 2013/0007076 A1 | 1/2013 | Wegener | | |

OTHER PUBLICATIONS

Islam, M., et al., "Characterizing and Exploiting Small-Value Memory Instructions," in IEEE Transactions on Computers, vol. 63, No. 7, pp. 1640-1655, Jul. 2014; abstract; Section 6.

Thuresson, M., et al., "Memory-Link Compression Schemes: A Value Locality Perspective," in IEEE Transactions on Computers, vol. 57, No. 7, pp. 916-927, Jul. 2008.; abstract; Sections 1, 3, and 6.

International Search Report and Written Opinion dated Sep. 20, 2016 by the International Searching Authority for International Patent Application No. PCT/SE2016/050463, which was filed on May 20, 2016 and published as WO 2016/186564 on Nov. 24, 2016 (Applicant—ZeroPoint Technologies AB) (11 pages).

International Preliminary Report on Patentability dated Jun. 7, 2017 by the International Searching Authority for International Patent Application No. PCT/SE2016/050463, which was filed on May 20, 2016 and published as WO 2016/186564 on Nov. 24, 2016 (Applicant—ZeroPoint Technologies AB) (6 pages).

Isenburg M et al: "Lossless compression of predicted floating-point geometry", Computer Aided Design, vol. 37, No. 8, pp. 869-877, (2005).

Wikipedia, "Floating-point arithmetic" URL: https://en.wikipedia.org/w/index.php?tide=Floating-point_arithmetic&oldid=661666669 [retrieved Nov. 30, 2018] (25 pages).

European Search Report dated Dec. 19, 2018 by the European Patent Office for EP Application No. 16796839.5, filed on May 20, 2016 and published as EP 3298695 A1 on Mar. 28, 2018 (Applicant—Zeropoint Technologies AB) (10 Pages).

* cited by examiner

METHODS, DEVICES AND SYSTEMS FOR SEMANTIC-VALUE DATA COMPRESSION AND DECOMPRESSION

CROSS-REFERENCE TO RELATED APPLICATIONS

This is a U.S. National Phase Application based on PCT/SE2016/050463, filed May 20, 2016 which claims priority from Swedish patent application No 1550644-7, filed on 21 May 2015 and bearing the title "METHODS, DEVICES AND SYSTEMS FOR DATA COMPRESSION AND DECOMPRESSION", the contents of which are incorporated herein in their entirety by reference.

TECHNICAL FIELD

The disclosure of this patent application generally relates to the field of data compression and decompression, for instance in a cache/memory subsystem and/or in a data transferring subsystem of a computer system, or in a data communication system.

BACKGROUND OF THE DISCLOSURE

Data compression is a well-established technique that is used to reduce the size of the data. It is applied to data that are saved in the memory subsystem of a computer system to increase the memory capacity. It is also used when data are transferred either between different subsystems within a computer system or in general when the transfer takes place between two points in a data communication system comprising a communication network.

Data compression requires two fundamental operations: 1) compression (also referred to as encoding) that takes as input uncompressed data and transform them to compressed data by replacing data values by respective codewords (also mentioned in the literature as encodings, codings or codes) and 2) decompression (also referred to as decoding) which takes as input compressed data and transform them to uncompressed by replacing the codewords with the respective data values. Data compression can be lossless or lossy depending on whether the actual data values after decompression are exactly the same to the original ones before being compressed (in lossless) or whether the data values after decompression are different than the original ones and the original values cannot be retrieved (in lossy). Compression and decompression can be implemented in software, or hardware, or a combination of software and hardware realizing the respective methods, devices and systems.

An example of a computer system 100 is depicted in FIG. 1. The computer system 100 comprises one or several processing units P1 ... Pn connected to a memory hierarchy 110 using a communication means, e.g., an interconnection network. Each processing unit comprises a processor (or core) and can be a CPU (Central Processing Unit), a GPU (Graphics Processing Unit) or in general a block that performs computation. On the other hand, the memory hierarchy 110 constitutes the storage subsystem of the computer system 100 and comprises a cache memory 120, which can be organized in one or several levels L1-L3, and a memory 130 (a.k.a. primary memory). The memory 130 may also be connected to a secondary storage (e.g., a hard disk drive, a solid state drive, or a flash memory). The memory 130 can be organized in several levels, for example, a fast main memory (e.g., DDR) and a flash memory. The cache memory 120 in the current example comprises three levels, where the L1 and L2 are private caches as each of the processing units P1-Pn is connected to a dedicated L1/L2 cache, whereas the L3 is shared among all the processing units P1-Pn. Alternative examples can realize different cache hierarchies with more, fewer or even no cache levels, and with or without dedicating caches to be private or shared, various memory levels, with different number of processing units and in general different combinations between the processing units and the memory subsystem, as is all readily realized by a skilled person.

Data compression can be applied to a computer system in different ways. FIG. 2 depicts an example 200 of a computer system, like for instance system 100 of FIG. 1, where data are compressed in the memory, for example in the main memory of such computer system. This means that data are compressed before being saved in the memory by a respective compression operation as mentioned above, and data are decompressed when they leave the memory.

In an alternative example 300 of a computer system, shown in FIG. 3, data compression can be applied to the L3 cache of the cache system. Similarly to the previous example, compression is required before data are saved in the cache and decompression is required before data leave the cache (e.g., to other cache levels (L2) or to the memory 330 where data are uncompressed). In alternative examples data can be saved compressed in any level of the cache hierarchy.

Data can be also compressed only when they are transferred between different subsystems in the computer system. In the alternative example 400 of a computer system shown in FIG. 4, data are compressed when transferred between the L3 cache and the memory 430 using the respective communication means. Similarly to previous examples, compression and decompression need to exist in the ends of the communication means so that data are compressed before being transferred and decompressed when they are received at the other end.

In an alternative example 500 of a computer system, data compression can be applied in a combination of subsystems as depicted in FIG. 5. In this example, data are compressed when they are saved in the memory 530 and when they are transferred between the memory 530 and the cache hierarchy 520. In this way, when data are moved from the cache hierarchy 520 to the memory 530, they may only need to be compressed before being transferred from the L3 cache. Alternatively, the compressed data that leave the memory 530 to the cache hierarchy 520 may only need to be decompressed when they are received to the other end of the communication means that connect the memory 530 to the cache hierarchy 520. Regarding the combination of applying compression to the different subsystems in a computer system, any example is possible and can be realized by someone skilled in the art.

Transfer of data can also take place between two arbitrary points within a communication network. FIG. 6 depicts an example of a data communication system 600 comprising a communication network 605 between two points, where data are transferred by a transmitter 610 and received by a receiver 620. In such an example, these points can be two intermediate nodes in a network or the source and destination nodes of a communication link or a combination of these cases. Data compression can be applied to such a data communication system, as is depicted for an example system 700 in FIG. 7. Compression needs to be applied before data are transmitted by a transmitter 710 onto a communication network 705, while decompression needs to be applied after received by a receiver 720.

There is a variety of different algorithms to realize data compression. One family of data compression algorithms are the statistical compression algorithms, which are data dependent and can offer compression efficiency close to entropy because they assign variable-length (referred to also as variable-width) codes based on the statistical properties of the data values: short codewords are used to encode data values that appear frequently and longer codewords encode data values that appear less frequently. Huffman encoding is a known statistical compression algorithm.

A known variation of Huffman encoding that is used to accelerate decompression is canonical Huffman encoding. Based on this, codewords have the numerical sequence property meaning that codewords of the same length are consecutive integer numbers.

Examples of canonical Huffman-based compression and decompression mechanisms are presented in prior art. Such compression and decompression mechanisms can be used in the aforementioned examples to realize Huffman-based compression and decompression.

An example of a compressor 900 from the prior art, which implements Huffman encoding e.g., canonical Huffman encoding, is illustrated in FIG. 9. It takes as input an uncompressed block, which is a stream of data values and comprises one or a plurality of data values generally denoted v1, v2, . . . , vn throughout this disclosure. The unit 910, which can be a storage unit or an extractor of data value out from the uncompressed block, supplies the Variable-length Encoding Unit 920 with data values. The Variable-length Encoding Unit 920 comprises the Code Table (CT) 922 and the codeword (CW) selector 928. The CT 922 is a table that can be implemented as a Look Up Table (LUT) or as a computer cache memory (of any arbitrary associativity) and contains one or a plurality of entries; each entry comprises a value 923 that can be compressed using a codeword, a CW 925 and a codeword-length (cL) 927. Because the set of the various codewords used by statistical compression algorithms is of variable-length, they must be padded with zeros when they are saved in the CT 922 where each entry has a fixed-size width (codeword 925). The codeword-length 927 keeps the actual length of the variable-length encoding (e.g., in bits). The CW selector 928 uses the cL in order to identify the actual CW and discard the padded zeros. The coded value is then concatenated to the rest of compressed values that altogether form the compressed block. An exemplary flow chart of a compression method that follows the compression steps as previously described is depicted in FIG. 11.

An example of a decompressor 1000 from the prior art is illustrated in FIG. 10. Canonical Huffman decompression can be divided into two steps: Codeword detection and Value retrieve. Each of these steps is implemented by a unit: (1) Codeword Detection Unit (CDU) 1020 and (2) Value Retrieve Unit (VRU) 1030. The aim of CDU 1020 is to find a valid codeword within a compressed sequence (i.e., the sequence of the codewords of the compressed data values). The CDU 1020 comprises a set of comparators 1022 and a priority encoder 1024. Each comparator 1022$a,b,c$ compares each potential bit-sequence to a known codeword, which is in this example the First-assigned (at the time of code generation) canonical Huffman codeword (FCW) for a specific length. In alternative implementation, the last-assigned canonical Huffman codeword could be used too, but in that case the exact comparison made would be different. The maximum size of the aforementioned bit-sequence to be compared, which can be saved in a storage unit 1010 (implemented for example as a FIFO or flip flops) and which determines the number of comparators and the maximum width of the widest of them, depends on the maximum length of a valid Huffman codeword (mCL) that is decided at code generation. However, this maximum length can be bounded to a specific value at design, compile, configuration or run time depending on the chosen implementation of such decompressor (e.g., in software or in hardware). The output of the comparators 1022 is inserted into the priority encoder like structure 1024 which outputs the length of the matched codeword (referred to as "matched length" in FIG. 10). Based on this, the detected valid codeword (matched codeword) is extracted from the bit-sequence which is saved in a storage unit 1010; the bit sequence is shifted by as many positions as the "matched length" defines and the empty part is loaded with the next bits of the compressed sequence so that the CDU 1020 can determine the next valid codeword.

The Value Retrieve Unit (VRU) 1030, on the other hand, comprises the Offset table 1034, a subtractor unit 1036 and the Decompression Look Up Table (DeLUT) 1038. The "matched length" from the previous step is used to determine an offset value (saved in the Offset table 1034) that must be subtracted (1036) from the arithmetic value of the matched codeword, determined also in the previous step, to get the address of the DeLUT 1038 where the original data value that corresponds to the detected codeword can be retrieved from it and attached to the rest of decompressed values that are kept in the Decompressed block 1040. The operation of the decompressor is repeated until all the values that are saved compressed in the input compressed sequence (mentioned as compressed block in FIG. 10) are retrieved as uncompressed data values v1, v2, . . . , vn.

An exemplary flow chart of a decompression method that follows the decompression steps as previously described is depicted in FIG. 12.

The aforementioned compressor and decompressor can quickly and effectively compress blocks of data with variable-length Huffman encoding and decompress blocks of data that are compressed with variable-length Huffman encoding. Other compression schemes that comprise compressors and decompressors which implement other compression and decompression algorithms, such as delta-based, pattern-based, etc. can be also used. A common characteristic of said schemes is that they make design-time assumptions on value locality to reduce compression or/and decompression latency. A common assumption is that value locality is best exploited by fixed-size data types (e.g., 32-bit integers). However, said schemes cannot compress effectively when the value to compress comprises semantically meaningful data fields. The present inventors have realized that there is room for improvements in the technical field of data compression and decompression.

SUMMARY OF THE DISCLOSURE

It is an object of the invention to offer improvements in the technical field of data compression and decompression.

This disclosure generally discloses methods, devices and systems for compressing a data set of data values and decompressing a compressed data set of data values, when compression is applied to for instance the cache subsystem and/or memory subsystem and/or data transferring subsystem in a computer system and/or a data communication system. There are various methods, devices and systems to compress data effectively in said subsystems using, for example, entropy-based variable-length encoding and one such way is by using Huffman encoding. However, said methods, devices and systems do not compress effectively when data values of said data set comprises a plurality of semantically meaningful data fields. According to a first concept of the present invention disclosure, compression is therefore not applied to each data value as a whole, but instead to at least one of the semantically meaningful data fields of each data value, and in isolation from the other semantically meaningful data fields of said data value, in order to generate a compressed data field; the compressed data field is then included in a resulting aggregated compressed data set. According to a second concept, the data fields that share the same semantic meaning are grouped together. This can accelerate compression and decompression as multiple compressors and decompressors can be used in parallel and improve the compression efficiency as various compression algorithms are used to compress the different groups. A third concept of the present invention disclosure is a system where methods and devices perform compression and decompression of the semantically meaningful data fields of floating-point numbers after considering first to further divide at least one said fields (e.g., mantissa) into two or a plurality of sub-fields to increase value locality and improve the compressibility. Said floating-point specific compression and decompression methods and devices are tailored to compress effectively the sub-fields of floating-point values and further reduce compression and decompression latency, which are critical for the performance of a cache subsystem and/or memory subsystem and/or data transferring subsystem in a computer system and/or a communication network, while avoiding adding area overheads due to metadata.

A first aspect of the present invention is a data compression device for compressing an uncompressed data set into a compressed data set, the uncompressed data set comprising a plurality of data values. The data compression device comprises a separator configured to divide each data value in the data set into a plurality of semantically meaningful data fields. The data compression device also comprises a compressor comprising one or more compression units, wherein a first compression unit among said compression units is configured to apply, for at least one of the semantically meaningful data fields of each data value, a first data compression scheme to that data field in isolation from other ones of the semantically meaningful data fields of the data value to generate a compressed data field. The data compression device also comprises an aggregator configured to include the compressed data field in a resulting aggregated compressed data set to generate the compressed data set. The data compression device offers improved data compression by allowing exploitation of value locality at data field level rather than data value level.

A second aspect of the present invention is a data compression method for compressing an uncompressed data set into a compressed data set, the uncompressed data set comprising a plurality of data values. The data compression method comprises: for each data value in the data set, dividing the data value into a plurality of semantically meaningful data fields; for at least one of the semantically meaningful data fields of each data value, applying a first data compression scheme to that data field in isolation from other ones of the semantically meaningful data fields of the data value to generate a compressed data field; and including the compressed data field in a resulting aggregated compressed data set to generate the compressed data set. The data compression method offers improved data compression by allowing exploitation of value locality at data field level rather than data value level.

A third aspect of the present invention is a computer program product comprising code instructions which, when loaded and executed by a processing device, cause performance of the method according to the second aspect above.

A fourth aspect of the present invention is a device comprising logic circuitry configured to perform the method according to the second aspect above.

A fifth aspect of the present invention is a data decompression device for decompressing a compressed data set into a decompressed data set, the compressed data set representing data values each of which has a plurality of semantically meaningful data fields, at least one of which has been compressed in isolation from other ones of the semantically meaningful data fields. The data decompression device comprises a decompressor comprising one or more decompression units, wherein a first decompression unit among said decompression units is configured to apply, for said at least one compressed data field of each data value, a first data decompression scheme to that compressed data field to generate a decompressed data field. The data decompression device comprises a mechanism configured to generate the decompressed data set by including each decompressed data field in a resulting data value of the decompressed data set.

A sixth aspect of the present invention is a data decompression method for decompressing a compressed data set into a decompressed data set, the compressed data set representing data values each of which has a plurality of semantically meaningful data fields, at least one of which has been compressed in isolation from other ones of the semantically meaningful data fields. The data decompression method comprises: for said at least one compressed data field of each data value, applying a first data decompression scheme to that compressed data field to generate a decompressed data field; and generating the decompressed data set by including each decompressed data field in a resulting data value of the decompressed data set.

A seventh aspect of the present invention is a computer program product comprising code instructions which, when loaded and executed by a processing device, cause performance of the method according to the sixth aspect above.

An eighth aspect of the present invention is a device comprising logic circuitry configured to perform the method according to the sixth aspect above.

A ninth aspect of the present invention is system comprising one or more memories, a data compression device according to the first aspect above and a data decompression device according to the fifth aspect above.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Examples from the background art as well as embodiments of inventive aspects are described with respect to the following figures.

DETAILED DESCRIPTION

Figure 1:
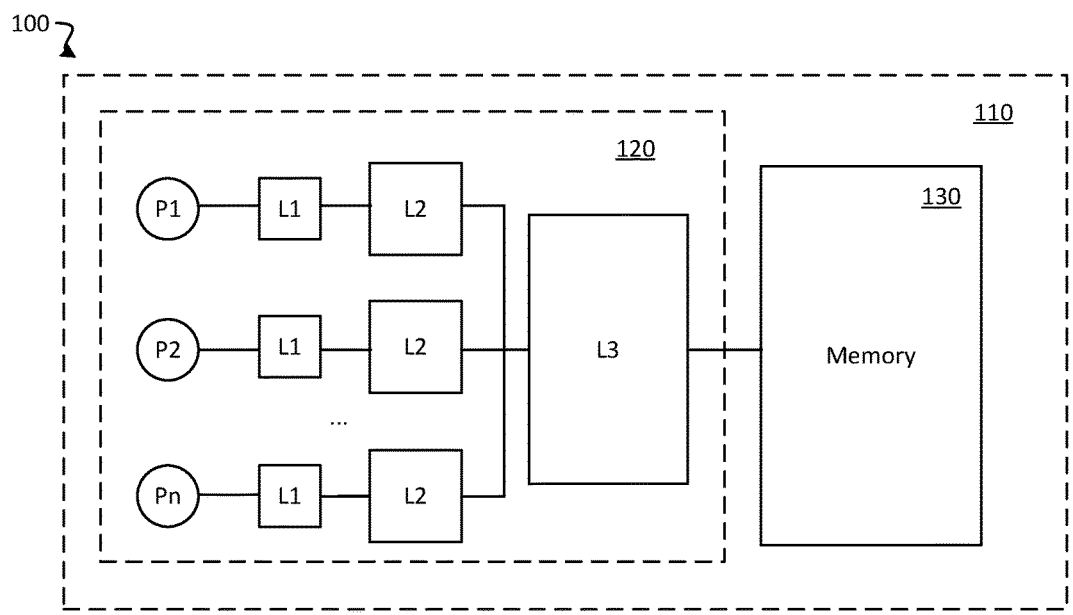
FIG. 1 illustrates a block diagram of a computer system that comprises n processing cores, each one connected to a cache hierarchy of three levels and the main memory.
Figure 2:
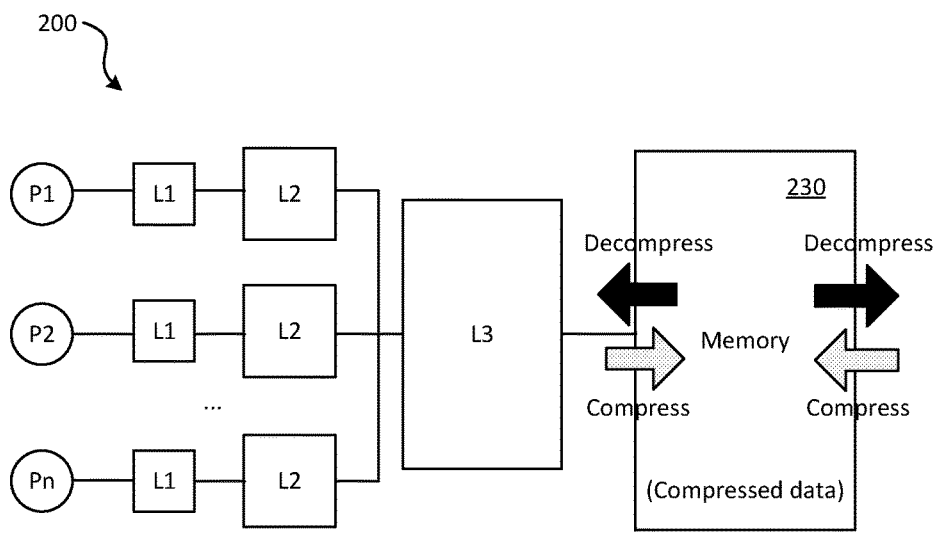
FIG. 2 illustrates the block diagram of FIG. 1, where the main memory saves data in compressed form.
Figure 3:
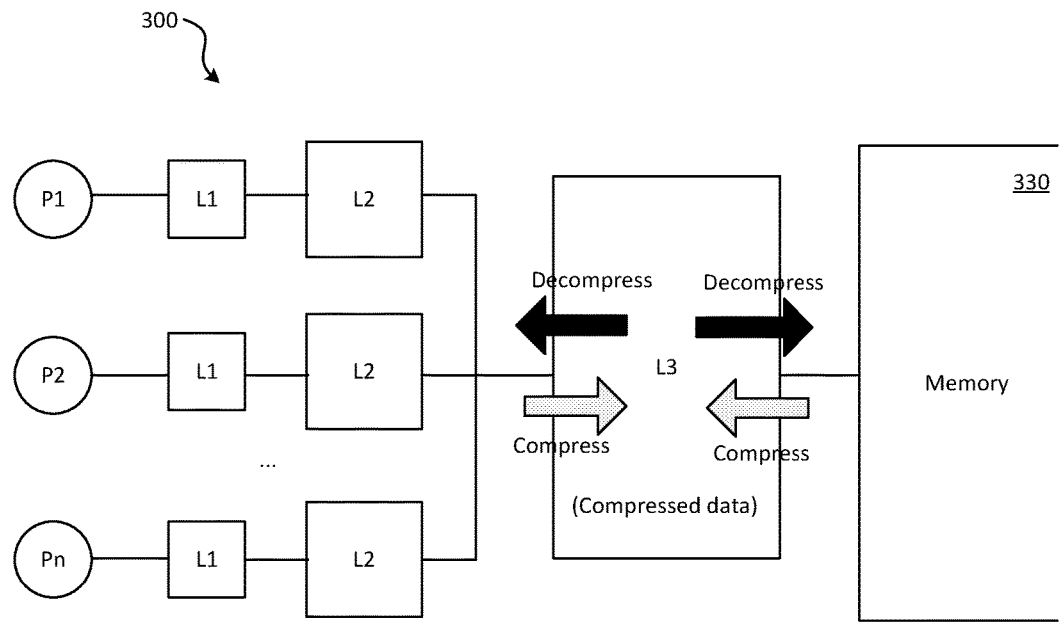
FIG. 3 illustrates the block diagram of FIG. 1, where the L3 cache saves data in compressed form. Other cache levels can also store data in compressed form.
Figure 4:
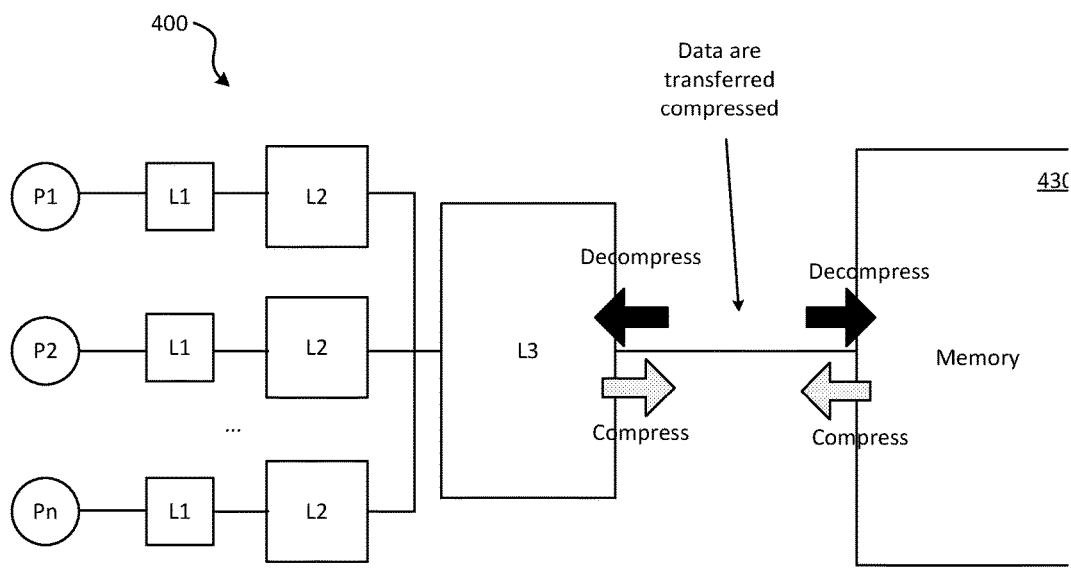
FIG. 4 illustrates the block diagram of FIG. 1 where data are compressed in a communication means, for example when transferred between the memory and the cache hierarchy.
Figure 5:
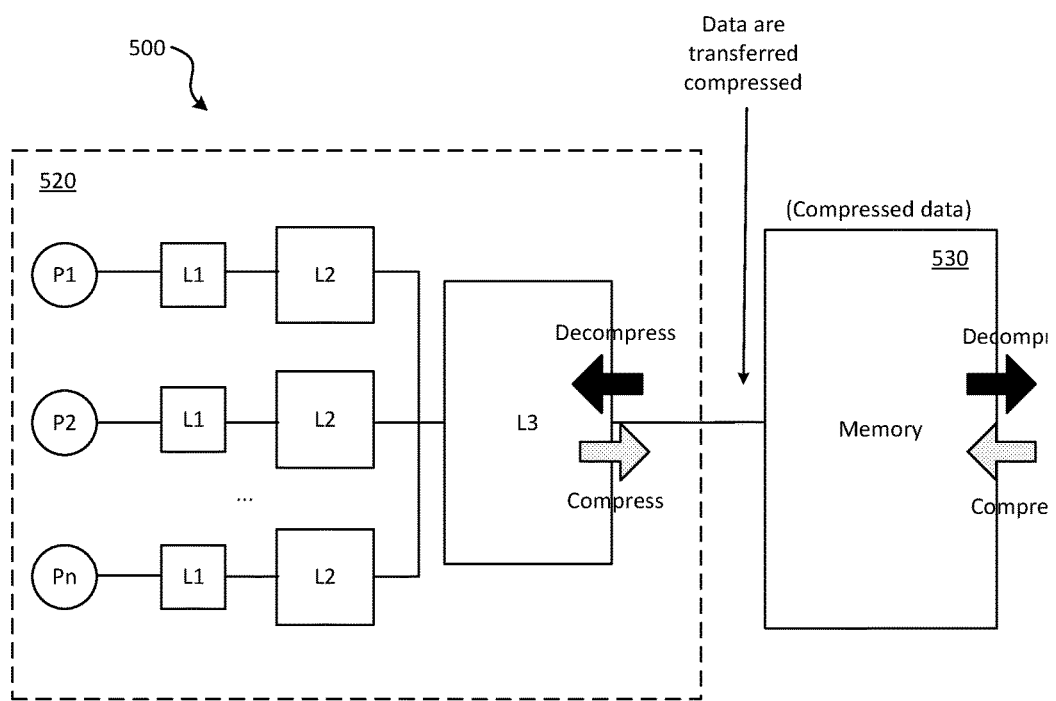
FIG. 5 illustrates the block diagram of FIG. 1 where compression can be applied to the main memory and the link that connects the memory to the cache hierarchy. In general compression can be applied to any combination of the parts like the cache hierarchy, the transferring means (e.g., link that connects the memory to the cache subsystem) and main memory.

The present disclosure discloses methods, devices and systems for compressing one or a plurality of data sets of data values and decompressing one or a plurality of compressed data sets of data values, when compression is applied to the cache subsystem and/or memory subsystem and/or data transferring subsystem in a computer system and/or a data communication system. Each said data set contains one or a plurality of data values of a certain data type and can be of arbitrary size. For each data value in the data set, the data value comprises a plurality of semantically meaningful data fields. In these disclosed methods, devices and systems, compression is not applied to the data value as a whole, but instead to at least one of the semantically meaningful data fields of each data value, and in isolation from the other ones of the semantically meaningful data fields of the data value in order to generate a compressed data field; the compressed data field is then included in a resulting aggregated compressed data set. The compression applied can be lossless or lossy, while various compression methods, devices and systems can be used to compress the various semantically meaningful data fields.

Not all semantically meaningful data fields may have to be subject to data compression. Advantageously, the value localities of the semantically meaningful data fields are considered, and the one(s) among the semantically meaningful data fields which exhibit(s) a high degree of value locality is/are subjected to data compression suitable to yield good compressibility based on value locality.

A data type can be integer, floating-point, char, string etc., or it can be a code instruction, but it can also be an abstract data type such as a data structure type, an object type, etc. Data of some data types may follow specific formats, e.g., video format, audio format, or specific standards, e.g., characters that follow the ASCII format, floating-point data that follow the IEEE-754 standard, etc. The example data set of FIG. 13 comprises 4 floating-point values of double precision that follow the format according to the IEEE-754 standard. According to said standard, a floating-point data value comprises three data fields: sign, exponent and mantissa (significand). The width of said bit-fields varies depending on the selected precision. In the example embodiment of FIG. 13 where the selected precision is double (64-bit), the sign bit-field is 1 bit, the exponent bit-field is 11 bits and the mantissa bit-field is 52 bits. Compression can be decided to be applied in, e.g., the sign and the exponent bit-fields of the values of the data set as they typically exhibit high value locality in contrast to the mantissa bit-field. Alternative data sets of floating-point values that follow other standards can be also considered. Yet another alternative data set that comprise values of certain types that follow a certain standard are the text types as defined by the Unicode standard (e.g., UTF-8, UTF-16).

Figure 14:
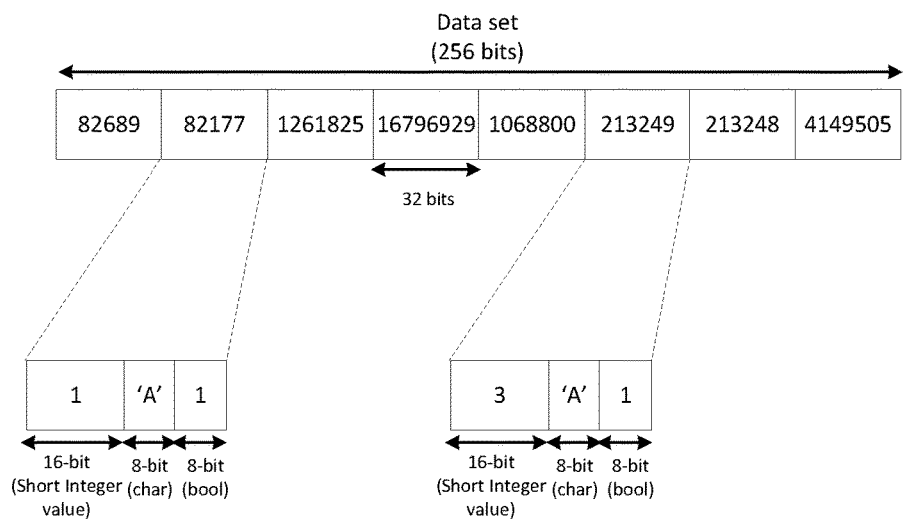
FIG. 14 illustrates a data set that comprises a plurality of values of a certain data type, where each value further comprises 3 three semantic bit fields of known types, according to a data structure format.

Another alternative data set is illustrated in FIG. 14 and comprises 8 values. Each of those values is a data structure (i.e., Abstract Data Type) and comprises three fields: a bit-field of type short integer (16 bits), a character bit-field (8 bits) and a bit-field of type Boolean. Similar to previous embodiments, compression can be selected to be applied to all the fields or a subset of them depending on the value locality exhibited.

The resulting aggregated compressed data set may advantageously be produced by grouping together compressed data fields sharing the same semantic meaning from the different data values, so that the compressed data fields appear adjacent each other in the aggregated compressed data set. This can improve compression efficiency, accelerate compression and especially decompression as well as reduce metadata and the overall complexity significantly because the different data fields can be compressed with different methods, devices and systems, therefore may use different encodings and thus require different compressors and decompressors. In particular, if compressed data of the same data field appear adjacent each other, they will all make use of the same decompressor without needing to switch between various decompressors or without needing to complicate the design of one decompressor to be able to decompress a plurality of bit-fields. Furthermore, the decompressors of different compressed fields can be used in parallel increasing the decompression throughput.

What will follow now in this disclosure is a description of certain embodiments of data compression devices and data decompression devices which are configured to operate according to the above. This description will be made with reference to FIG. 15-FIG. 21. Then, this disclosure will present general inventive aspects, generalized over the specific embodiments shown in FIG. 15-FIG. 21, These general inventive aspects will be described with reference to FIG. 22-FIG. 26.

Figure 15:
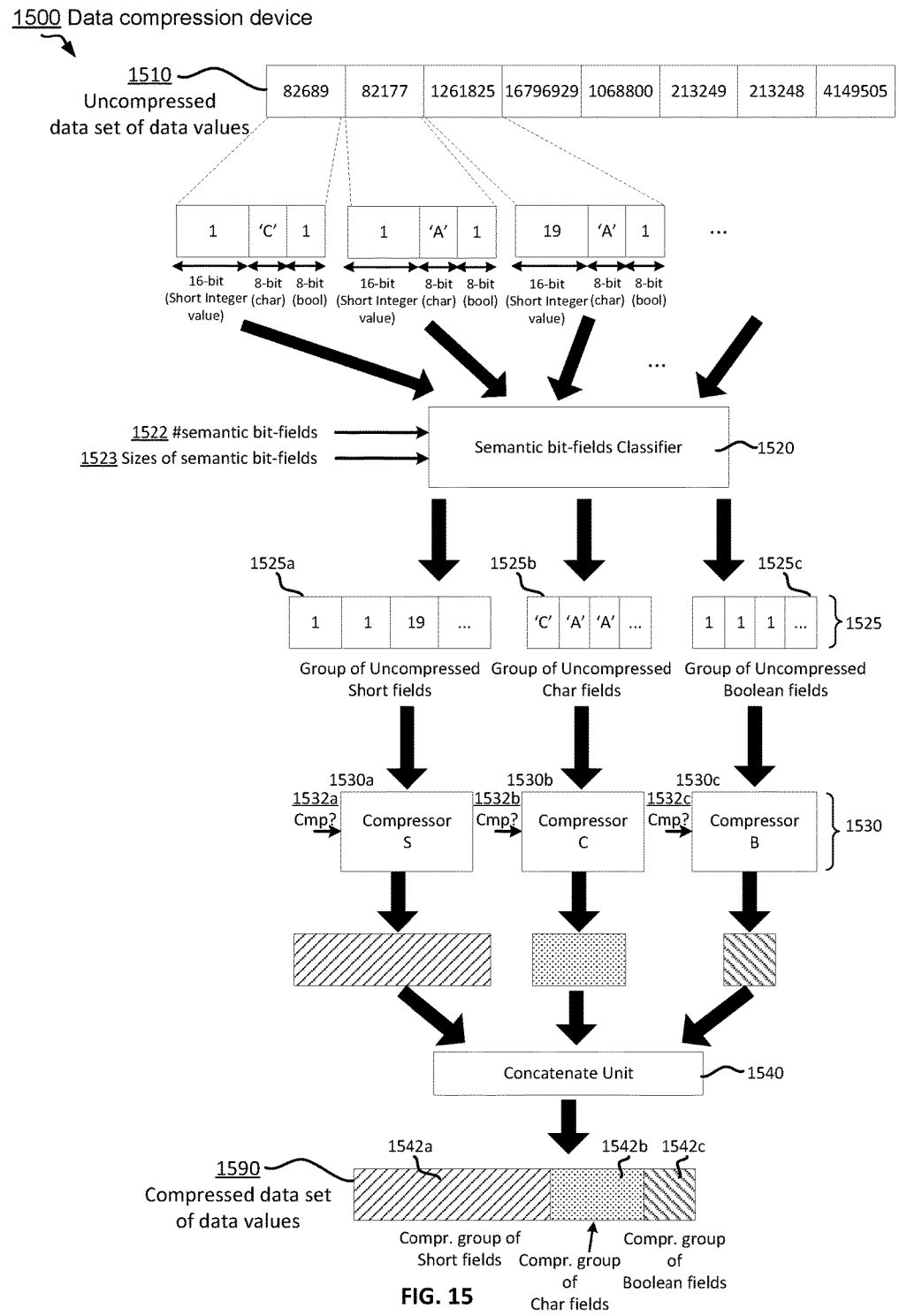
FIG. 15 illustrates a block diagram of an example data compression device that compresses the three semantic bit fields of all the values of the data set of FIG. 14 by first classifying said bit-fields into three groups.

A block diagram of an embodiment of a data compression device 1500, which compresses the example data set of FIG. 14, by grouping together the data fields of a uncompressed data set 1510 that share the same semantic meaning and then compressing each of the various groups in isolation, is illustrated in FIG. 15. The data compression device 1500 comprises a separator in the form of a Semantic bit-field Classifier 1510, storage units 1525 for the various groups, one or a plurality of data compression units 1530 (also referred to as compressors or compressor engines in this disclosure), and an aggregator in the form of a concatenate unit 1540. The initial data set is first inserted into the Semantic bit-fields Classifier 1520. The Classifier 1520 also takes as inputs 1522, 1523: the Number of the Semantic bit-fields, which the values of the data set consist of, and the Sizes of the different semantic bit fields. The working of the Classifier 1520 is further described in the example method of FIG. 16. The output of the Classifier 1520 is a plurality of groups of the uncompressed bit-fields, which are saved in the storage unit(s) 1525. In this particular embodiment, there are three groups of bit-fields: 1) The Group of (Integer) Short fields (stored in storage unit 1525a), 2) the Group of Char fields (stored in storage unit 1525b) and 3) the Group of Boolean fields (stored in storage unit 1525c). The various groups of bit-fields are going to be compressed by the plurality of compressors 1530. Each of these compressors encodes a particular group and can implement a particular compression algorithm (i.e. scheme) that is suitable for said group: hence, the Compressor S 1530a compresses the group of short integer bit-fields; the Compressor C 1530b compresses the group of character fields; and the Compressor B 1530c compresses the group of boolean fields. Said compressors run a lossless or lossy compression algorithm (scheme) or they can be configured accordingly among a variety of compression algorithms based on the target exact type of said bit-field, either by speculating on the type or by providing information about said type as described later.

In some embodiments, a compressor 1530a, 1530b, 1530c can be configured to not compress at all a particular group by setting accordingly an input parameter 1532a, 1532b, 1532c (seen as "Cmp?" in FIG. 15), if the value localities of the semantically meaningful data fields are considered unsuitable to yield efficient compression for this group of bit-fields or for other reasons. In the end, the compressed groups of bit-fields are concatenated by the Concatenate unit 1540, which forms a compressed data set 1590 as depicted at the bottom of FIG. 15. Hence, the compressed data set 1590 comprises a compressed group 1542a of data fields of the data type short integer, followed by a compressed group 1542b of data fields of the data type character, and finally a compressed group 1542c of data fields of the data type boolean, as resulting from the compression schemes applied by the respective compression units (compressor) 1530a, 1530b, 1530c.

Figure 16:
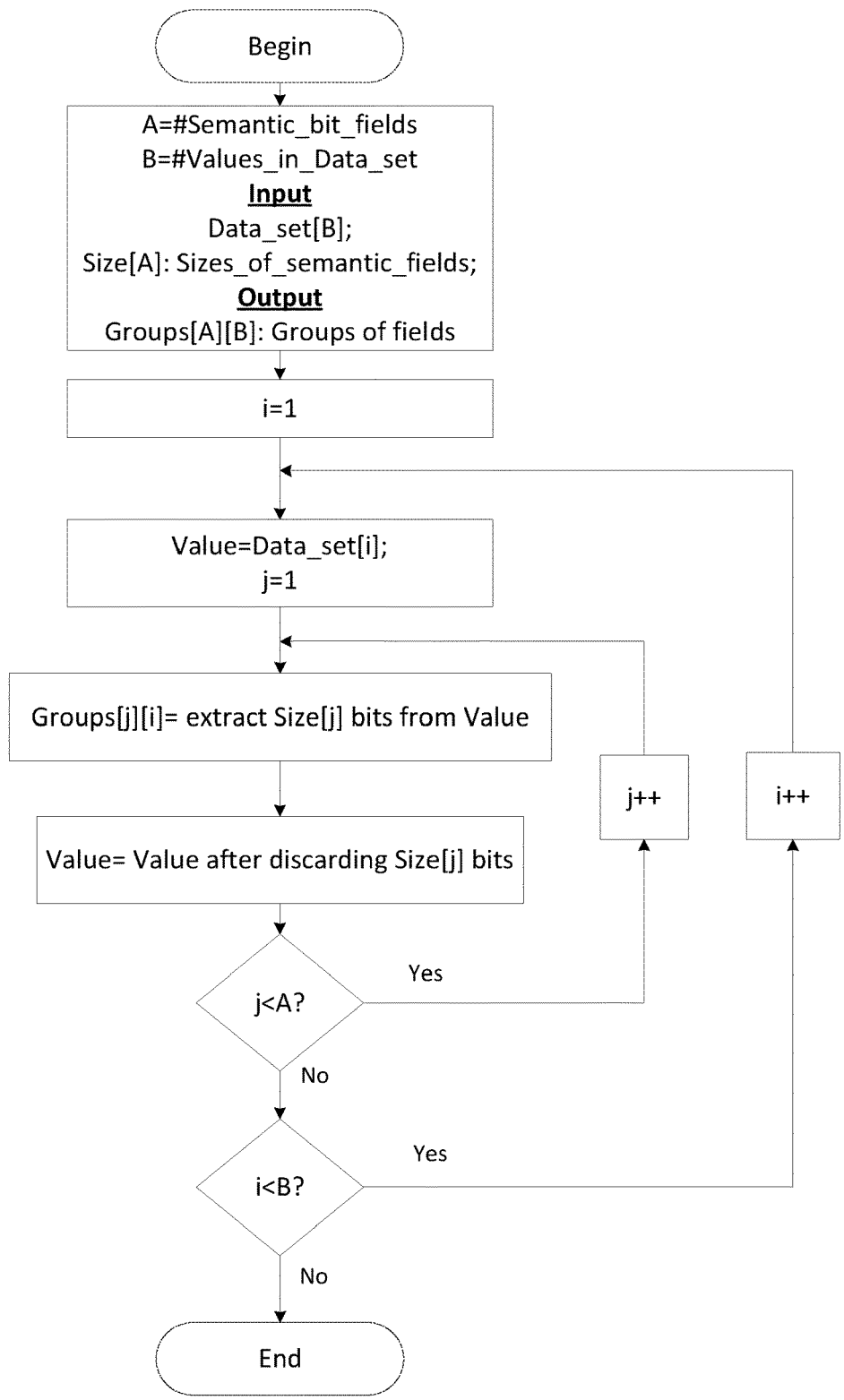
FIG. 16 illustrates an exemplary flow chart of a Semantic bit-fields Classifier method, which may be used by the embodiment of the data compression device in FIG. 15.

An exemplary flow chart of a Semantic bit-fields Classifier method, which is implemented by the Classifier unit 1520 of the data compression device 1500 embodiment of FIG. 15, is depicted in FIG. 16. The method takes as input a data set, which comprises B values, the sizes of the semantic bit-fields (measured in bits) as well as the number of the semantic bit-fields each value comprises, which is A. The output of the method is the groups of the semantic bit-fields organized as a 2-dimension array of size A×B. For each value in the data set, i, each of the bit-fields, j, is extracted from said value iteratively. The bit-field extraction for each value can be sequential or it can be parallelized since the sizes of the semantic bit-fields are known in advance. Similarly the bit-field extraction for a plurality of values of the data set can be sequential or it can be parallelized as well. Assuming that said Classifier method is used for grouping the semantic bit-fields of the values of the data set of FIG. 14, then the number of semantic bit-fields A is 3, (short integer, char and Boolean), the number of data-set values B is 8. Depending on the target implementation, said Classifier method can be implemented in software or in logic circuitry by someone skilled in the art. Alternative embodiments of said method can be also realized by someone skilled in the art.

The information (e.g. 1522, 1523 in FIG. 15), which comprises the Number and the Sizes of the Semantic bit-fields and is needed by the Classifier (e.g. 1520 in FIG. 15), can be extracted in one example embodiment wherein the data set that comprises semantic bit-fields is a data structure, from the application binary or the programming language primitives. Then, if said example embodiment is a compressor applied to the cache subsystem and/or memory subsystem and/or data transferring subsystem in a computer system, said extracted information is provided to the Classifier via (but not limited to) specialized commands by the system software to the underline hardware. In an alternative embodiment, where the compressor is applied to data that correspond to media data (e.g., data that follow an example video format), said information can be provided by a media center. In yet another alternative embodiment, where said compressor is applied to data that follow a particular standard or format, for example, floating-point data according to IEEE-754 standard, said information may be generated based on said used standard. Information about the data type of said semantic bit-fields can be provided in a similar way as is done for the Number and the Sizes of the Semantic bit-fields, to the compressor to accordingly configure the compressor engines (e.g. 1530 in FIG. 15) for the different groups of bit-fields, for embodiment where said compressor engines can be configured with one among a plurality of compression algorithms. Those skilled in the art can realize alternative ways to provide or generate such said information for other embodiments.

Figure 17:
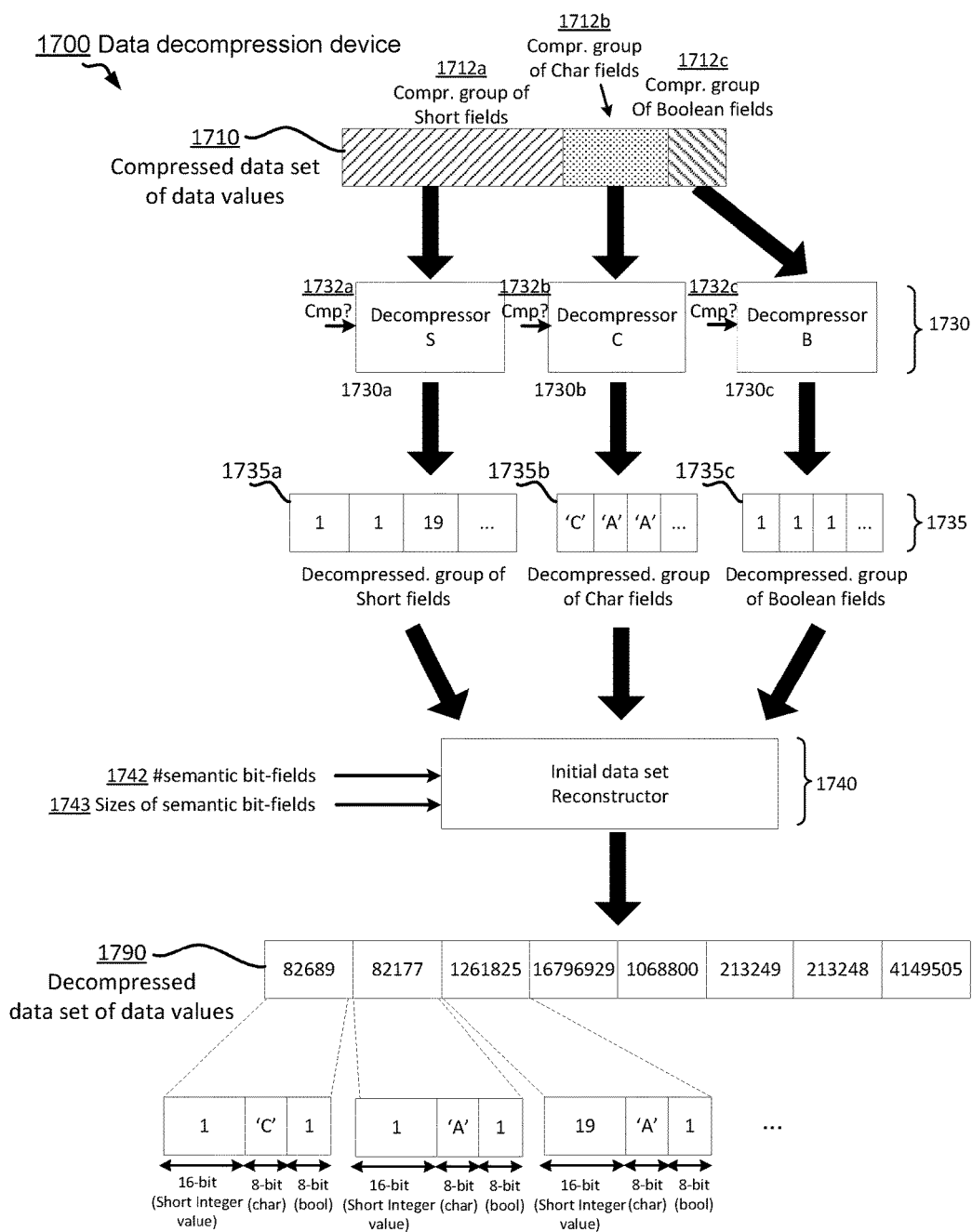
FIG. 17 illustrates a block diagram of an example data decompression device that decompresses the compressed semantic bit fields of all the values of the data set of FIG. 14 and then reconstructs the initial data set.

A block diagram of an embodiment of a data decompression device 1700, which decompresses an example compressed data set 1710, is illustrated in FIG. 17. The compressed data set 1710, which may have been produced by the data compression device 1500 of FIG. 15, comprises a compressed group 1712a of data fields of the data type short integer, followed by a compressed group 1712b of data fields of the data type character, and finally a compressed group 1712c of data fields of the data type boolean. The data decompression device 1700 comprises a plurality of decompression units 1730 (also referred to as decompressors or decompressor engines in this disclosure), storage units 1735 for the decompressed groups of bit-fields, and a mechanism in the form of a Reconstructor unit 1740 configured to generate a decompressed data set 1790. First, each of the various groups 1712a, 1712b, 1712c of compressed data fields is decompressed by a respective decompression unit 1730a, 1730b, 1730c, each of which is configured to decompress a respective one of the groups 1712a, 1712b, 1712c. Decompression of the various groups can be done sequentially or in parallel. However, parallel decompression requires that the boundaries of the various groups of compressed fields are known: either saved as metadata, or because the encoding sizes are fixed. Afterwards, each group of decompressed fields is saved in the storage units 1735, and all of the groups are then processed by the Reconstruction unit 1740 that generates the decompressed data set 1790 of data values, as depicted at the bottom of FIG. 17.

Figure 18:
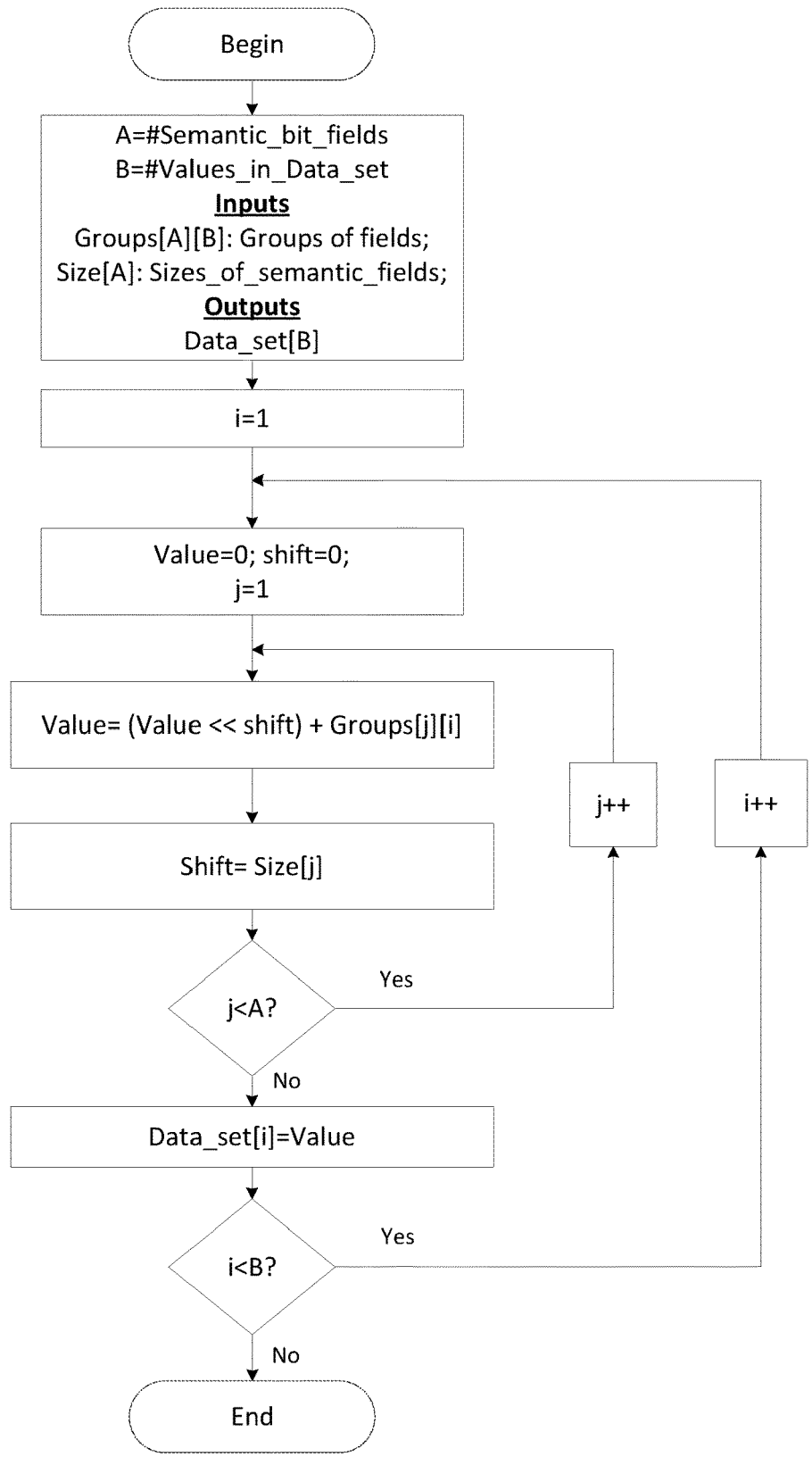
FIG. 18 illustrates an exemplary flow chart of an Initial Data Set Reconstruction method, which may be used by the embodiment of the data compression device in 17.

An exemplary flow chart of an Initial Data Set Reconstruction method, which is implemented by the Reconstruction unit 1740 of the data decompression device 1700 of FIG. 17, is depicted in FIG. 18. The method takes as input the groups of the semantic bit-fields, which are decompressed by the decompressors 1710 of FIG. 17, organized as a 2-dimension array of size A×B and the sizes of the semantic bit-fields (measured in bits) as well as the number of the semantic bit-fields each value comprises, which is A. The output of the method is a data set, which comprises B values. Starting from the first entry of each bit-field group and going iteratively to second, third, etc. entry of all bit-field groups, each value is formed by combining the semantic bit-fields of the various groups together by placing them in the respective bit-positions of the value-to-form as indicated by the aggregated sizes of the bit-fields. For example, assuming that the Reconstruction method is used to restore the data set of FIG. 14, each data value of the data set is formed by combining the bit-fields "short integer", "character" and "boolean" together from left to right placing them in the bit-positions 0-15, 16-23 and 24-31 respectively, assuming that the bit position 0 corresponds to the beginning (left) of the value and 31 corresponds to the end (right) of the value. Each value is concatenated to the rest of reconstructed values in the data set. The combination of bit-fields for each value can be sequential or it can be parallelized, since the sizes of the semantic bit-fields are known in advance. Similarly the value reconstruction for a plurality of values of the data set can be sequential or it can be parallelized as well. Depending on the target implementation, said Reconstructor method can be implemented in software or in logic circuitry by someone skilled in the art. Alternative embodiments of said method can be also realized by someone skilled in the art.

The aforementioned embodiments of the compressor of FIG. 15 and the decompressor of FIG. 17 have three Compressor units 1530 and three Decompressor units 1710 respectively. Hence, they can support compression of up to three different groups of fields, however, alternative embodiments can be realized by someone skilled in the art to have a larger number of available compressors/decompressors that can be configured. Said number of compressors must be bounded to a maximum number of bit-fields supported by said compressor and decompressor, unless the target system is a system that includes reconfigurable logic, e.g., FPGAs; therefore, a variable number of compressors/decompressors can be configured at run time.

Figure 13:
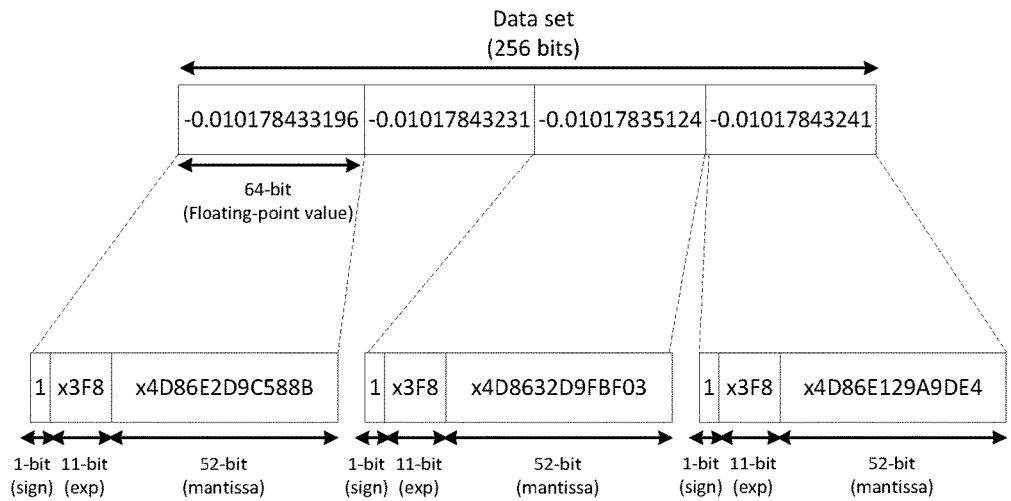
FIG. 13 illustrates a data set that comprises a plurality of 64-bit double precision floating-point values, where each value further comprises three semantic bit fields (sign, exponent and mantissa) according to the IEEE-754 standard.
Figure 19:
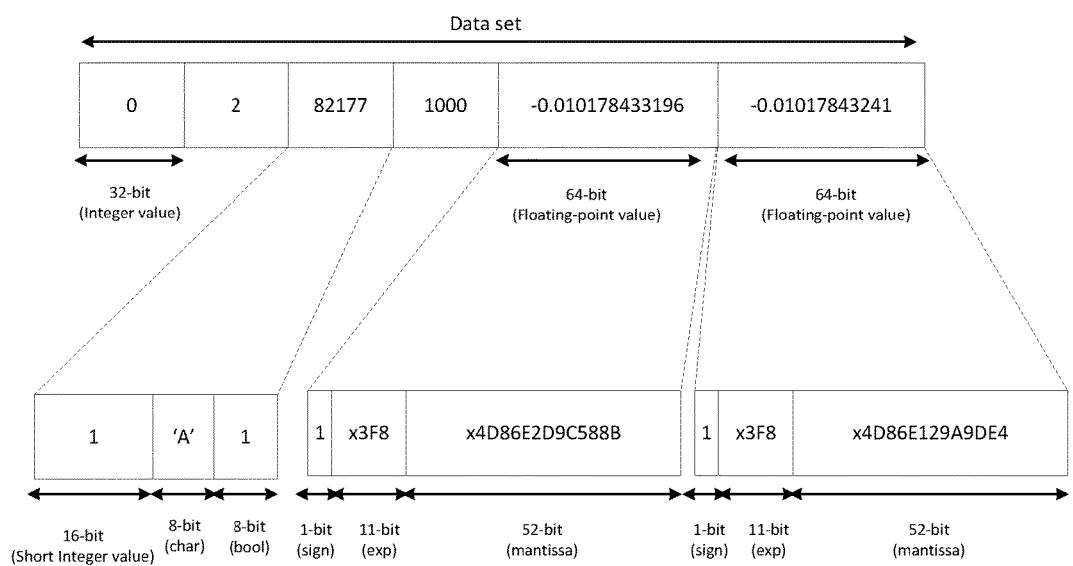
FIG. 19 illustrates a block of data values that comprises a plurality of values of various data types.

FIG. 19 depicts a block of data values which, contrary to the data sets of FIG. 13 and FIG. 14, comprises one or a plurality of data values, which are of various types, and each data value does not necessarily comprise a plurality of semantically meaningful data fields or a plurality of data fields sharing a same semantical meaning. The example of said block depicted in FIG. 19 comprises 6 values: three are of type integer; one value is a data structure like in the embodiment of FIG. 14; and the other two values are double-precision floating-point values (64-bits), which each comprises three semantic bit-fields (sign, exponent and mantissa) according to the IEEE-754 standard. Said block of data values can be compressed by the methods, devices and systems of the present disclosure, either by treating the block of data values as a particular data set of data values, or by forming one or a plurality of data sets of data values within said block of data values by including in each data set those data values that comprise the same semantic-bit fields. The rest of data values can be either left uncompressed or compressed using conventional compression methods, devices and systems.

Figure 6:
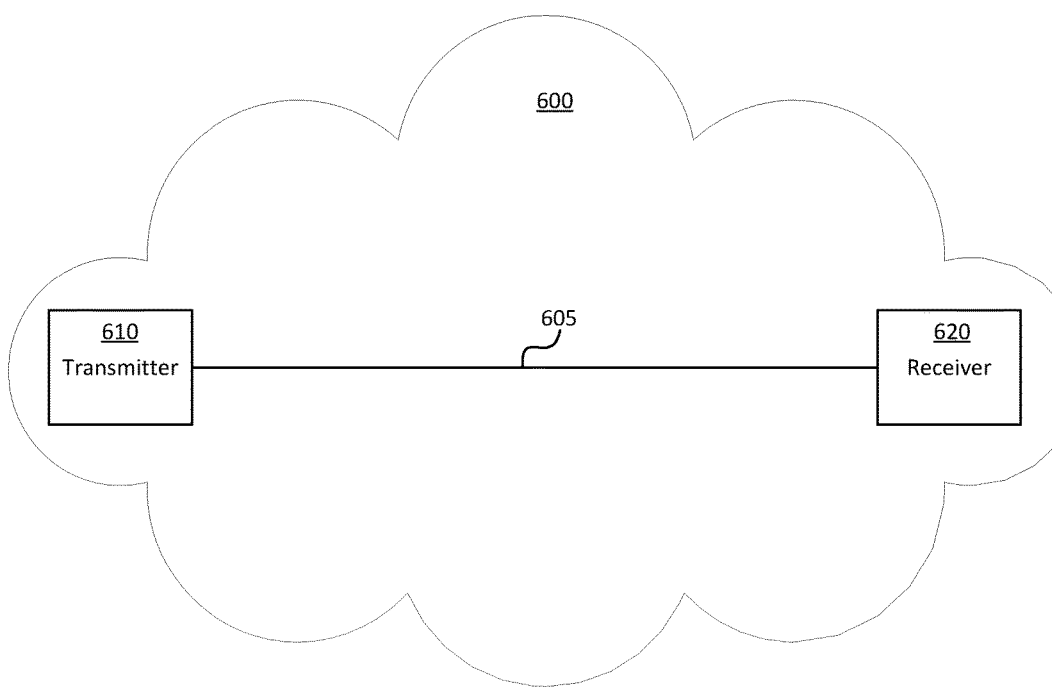
FIG. 6 illustrates a block diagram of a data transmission link that connects two points in a communication network. These points can be two intermediate nodes in the network or the source and destination nodes of a communication link or a combination of these cases.

In the embodiment of a computer system, as depicted in FIG. 1, a block of data values can be alternatively referred to as 1) a cache line, a cache set, a cache sector or similar when the block of data is saved in the cache hierarchy, 2) as a cache line, a memory page, a memory sector or similar when the block of data is saved in the memory or transferred in the communication means within such computer system. On the other hand, in the embodiment of a transmission link within a data communication system as depicted in FIG. 6, a block of data may also refer to packet, flit, payload, header, etc.

If the certain data type of the values of a data set is advantageously floating-point numbers pursuant to any available standard, wherein the semantically meaningful data fields may include the sign, exponent and mantissa of such floating-point numbers, one or more of the data fields may be further sub-divided, such as for instance by dividing the mantissa into two sub-fields: a mantissa-high and a mantissa-low. It is challenging to compress the mantissa; its least significant bits exhibit high irregularity (i.e., the probability for a bit in the mantissa's least-significant bits to be 1 (or 0) is 50%) because they change rapidly even at tiny changes of the real number represented, as can be observed in FIG. 13. On the other hand, compressing the mantissa will eventually improve the floating-point compressibility significantly as it is the major part of a floating-point number. For this reason, the division of the mantissa into two or a plurality of sub-fields can reveal that some sub-fields exhibit value locality, thus mantissa could be partly compressible. For example, in the data set embodiment of FIG. 13, the 20 most significant bits of the mantissa (i.e., x4D86E) is the same for the 3 out of 4 mantissa bit-fields of said data set; similarly, the 16 most significant bits of the mantissa (i.e., x4D86) is the same for the all the mantissa bit-fields of said data set. Hence, extracting these 16 or 20 bits out of the mantissa by dividing it for example into two sub-fields, it can improve the overall compressibility of the mantissa.

Figure 20:
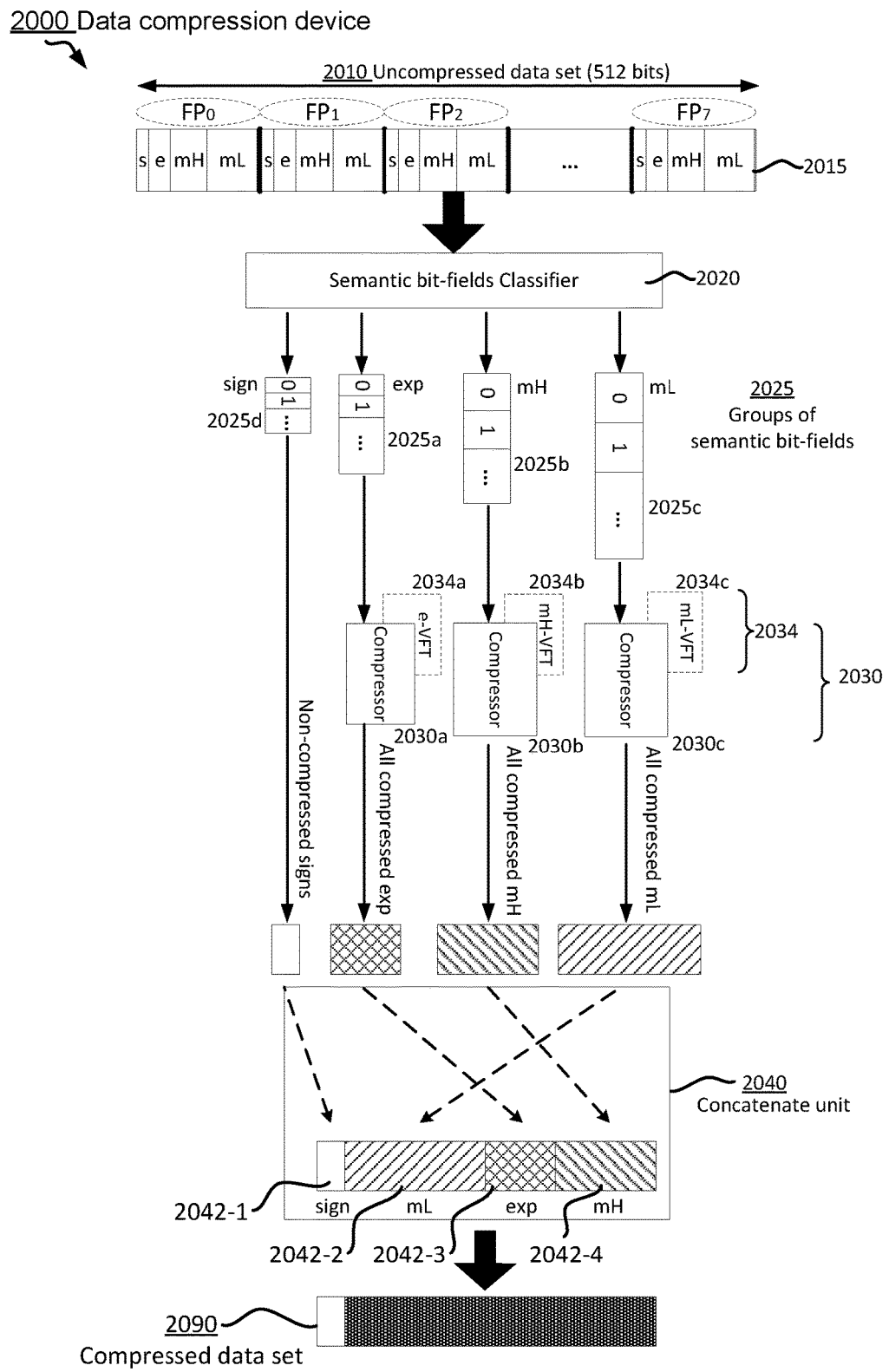
FIG. 20 illustrates a block diagram of an example data compression device that divides the floating-point values of a data set into four sub-fields: three are based on the semantic bit fields according to the IEEE-754 standard; one of those (i.e., mantissa) is further divided into two more sub-fields as higher degree of value locality is revealed: mantissa-High and mantissa-Low. This data compression device compresses the exponent, mantissa-High and mantissa-Low.
Figure 21:
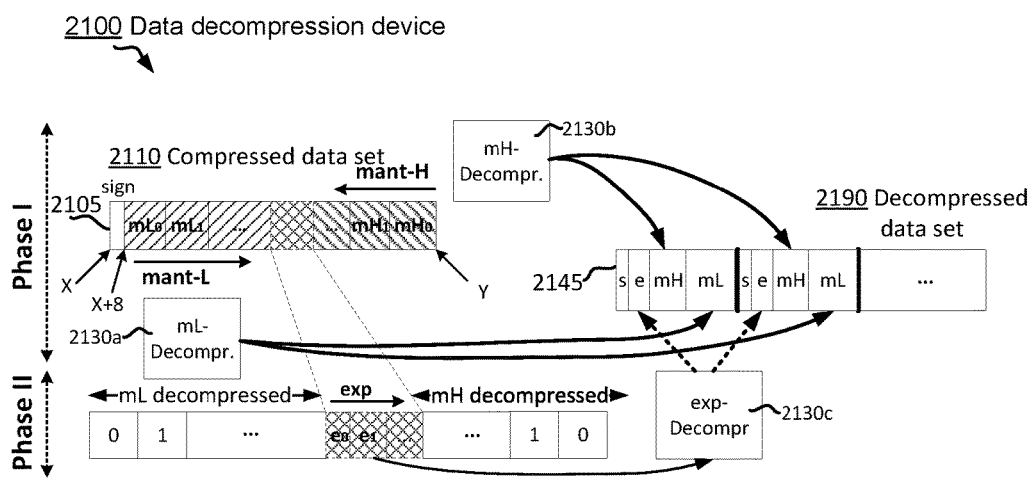
FIG. 21 illustrates a block diagram of an example data decompression device that decompresses the three out of four groups of compressed sub-fields in such a way as to accelerate decompression.

Embodiments of a data compression device 2000 and a data decompression device 2100 of an example system, which performs compression and decompression of the semantically meaningful data fields of floating-point numbers and considers to further divide the mantissa into two or a plurality of sub-fields, are depicted in FIG. 20 and FIG. 21, respectively. Said example system is referred to as FP-H.

A block diagram of an embodiment of the data compression device 2000 of FP-H is shown in FIG. 20. The data compression device 2000 comprises a storage unit and/or extraction unit 2015, a separator in the form of a Semantic bit-field Classifier 2020, storage units 2025 for the groups of semantic bit-fields, compression units (compressors) 2030 which are configured to compress said various semantically meaningful data fields, and an aggregator in the form of a concatenate unit 2040. The storage/extraction unit 2015 is used to keep and/or extract the floating-point values of an uncompressed data set 2010 into the Classifier 2020, which is built in a similar way as the example Classifier of FIG. 16. The data set in this example compressor comprises a plurality of 8 double-precision floating-point values that are formatted according to the IEEE-754 standard. Alternative compressor embodiments can support other floating-point precisions, other floating-point representations (e.g., decimal) or other standards, while the data set can be of any arbitrary size.

Compression is carried out in the following steps:

(Step-1) Each of the floating-point values of the input uncompressed data set 2010 is divided by the Classifier 2020 into four sub-fields, which are then organized together and stored in the storage units 2025. The four sub-fields are: Sign (s), Exponent (referred to as e or exp), mantissa-High (mH) and mantissa-Low (mL); the sizes of mH and mL sub-fields, which the mantissa field is divided into, can be determined statically or dynamically based on the value-locality degree revealed when separating the mantissa.

Figure 9:
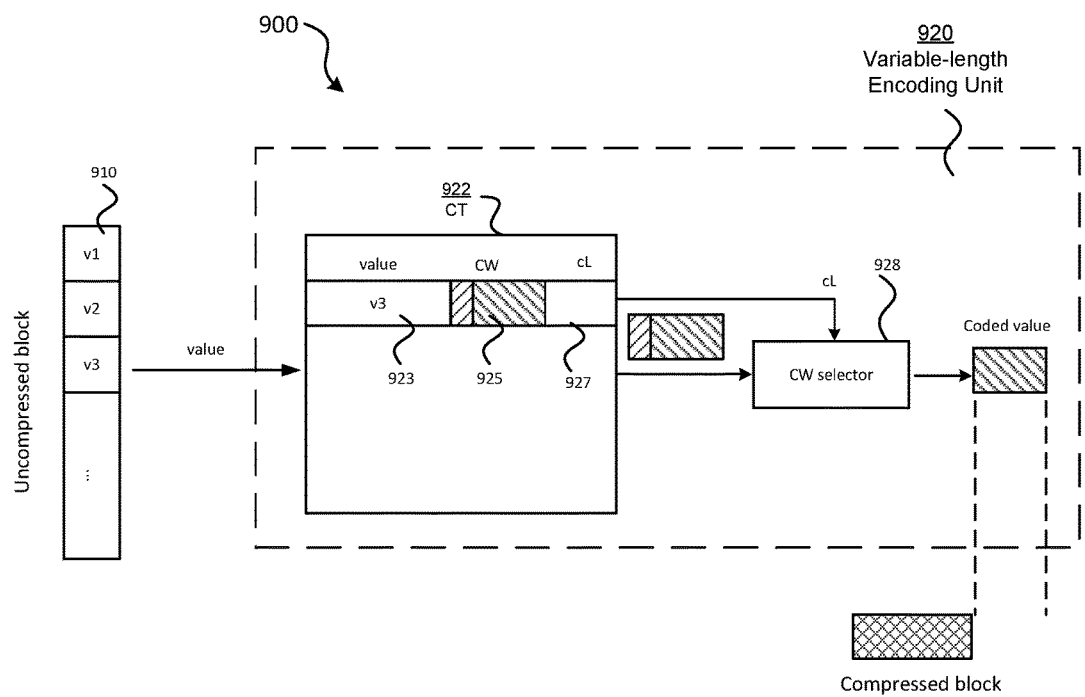
FIG. 9 illustrates a compressor that is used to compress (or encode) blocks using Huffman encoding, as illustrated in FIG. 8.

(Step-2) Each sub-field is compressed separately and in parallel with the rest of sub-fields by the respective compressor 2030. Although other lossless or lossy compression algorithms can be used, the example FP-H system employs variable-length statistical compression, such as Huffman encoding, as it can aggressively take advantage of the high value locality that is exhibited. Hence, the example compressor of FIG. 9 can be used to implement each of the compressors 2030.

(Step-3) The FP-H data compression device 2000 selects to attempt to compress all the data sub-fields except for the sign, as it constitutes a small fraction of a floating-point value. However, alternative embodiments can target sign compression too. The compressed sub-fields organized in groups are concatenated together by the concatenate unit 2040 in a certain order (i.e., sign, compressed mL, compressed exp, compressed mH) to form a compressed data set 2090 as shown at the bottom of FIG. 20. Field grouping is not necessary but beneficial; as various variable-length encodings are used, this way of restructuring the data of the compressed data set 2090 can dramatically accelerate decompression without requiring to keep metadata to define the boundaries of the various compressed sub-fields. Since variable-length statistical compression is employed for the compression of the mantissa sub-fields and for the exponent, the value-frequency statistics for each sub-field are monitored during the sampling (or training) phase using an example Value Frequency Table (VFT) structure (or Value Table): the e-VFT 2034*a*, mH-VFT 2034*b*, mL-VFT 2034*c*. The commonly owned patent application U.S. Ser. No. 13/897,385 describes example embodiments of said VT and said training phase.

A block diagram of an embodiment of the data decompression device 2100 of FP-H is shown in FIG. 21. The data decompression device 2100 comprises a storage unit 2105 which keeps the input compressed data set 2110, a plurality of decompression units including mantissa sub-field decompressors 2130*a* and 2130*b* and an exponent decompressor 2130*c*, and a storage unit 2145 that keeps the decompressed and reconstructed data set 2190. The boundaries of a compressed data set are known: beginning is denoted by 'X' and the end by 'Y', as shown in FIG. 21. As described previously in the compressor embodiment, there is no metadata to keep information about the boundaries and the exact offsets/sizes of the variable-length compressed mH and exponent (e) sub-fields, because metadata increase the area overheads, thus they diminish the benefits of compression. Hence, decompression for each of these sub-fields must wait for the decompression of the previous sub-field to complete: first decompress mL, then e and eventually mH. The group of the compressed mL sub-fields is placed in the 8th bit position of the compressed data set 2110, as the group of uncompressed sign bits is placed in the beginning of the compressed data set (i.e., X). As decompression of variable-length Huffman encoding is inherently sequential, this could increase the decompression latency significantly.

Figure 10:
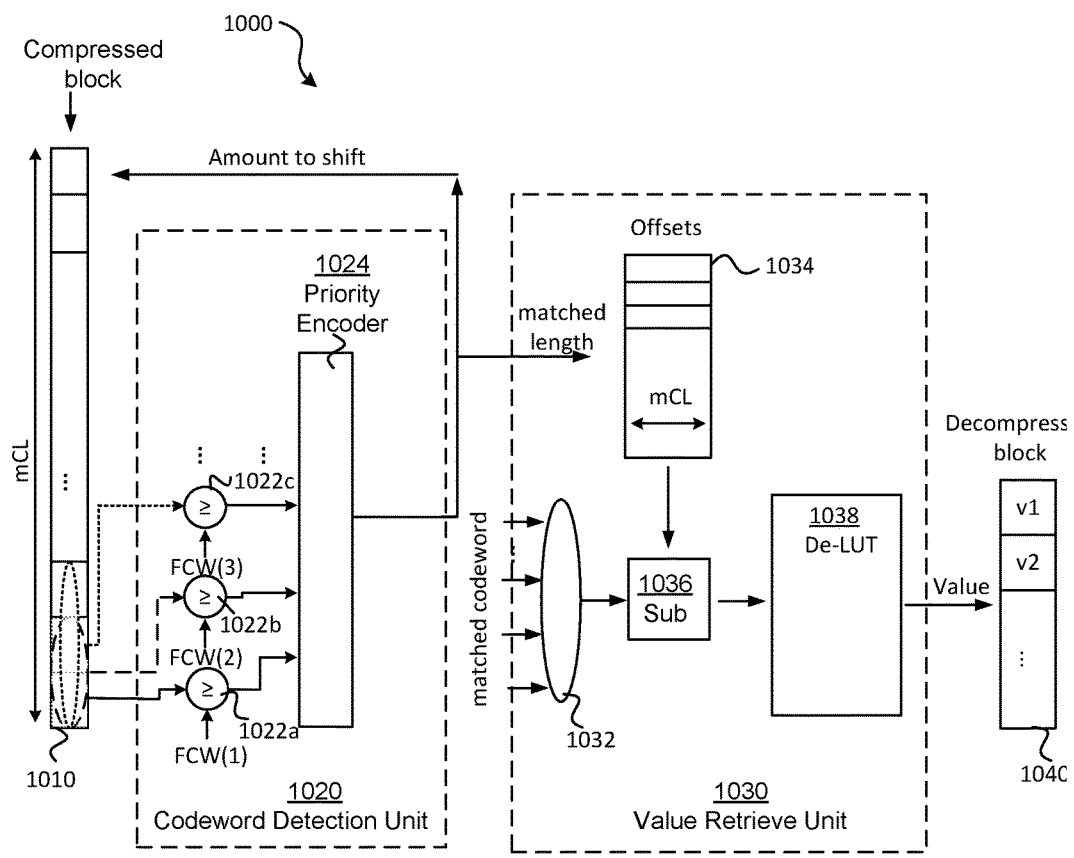
FIG. 10 illustrates a decompressor that is used to decode (or decompress) blocks that were compressed using canonical Huffman encoding.
Figure 11:
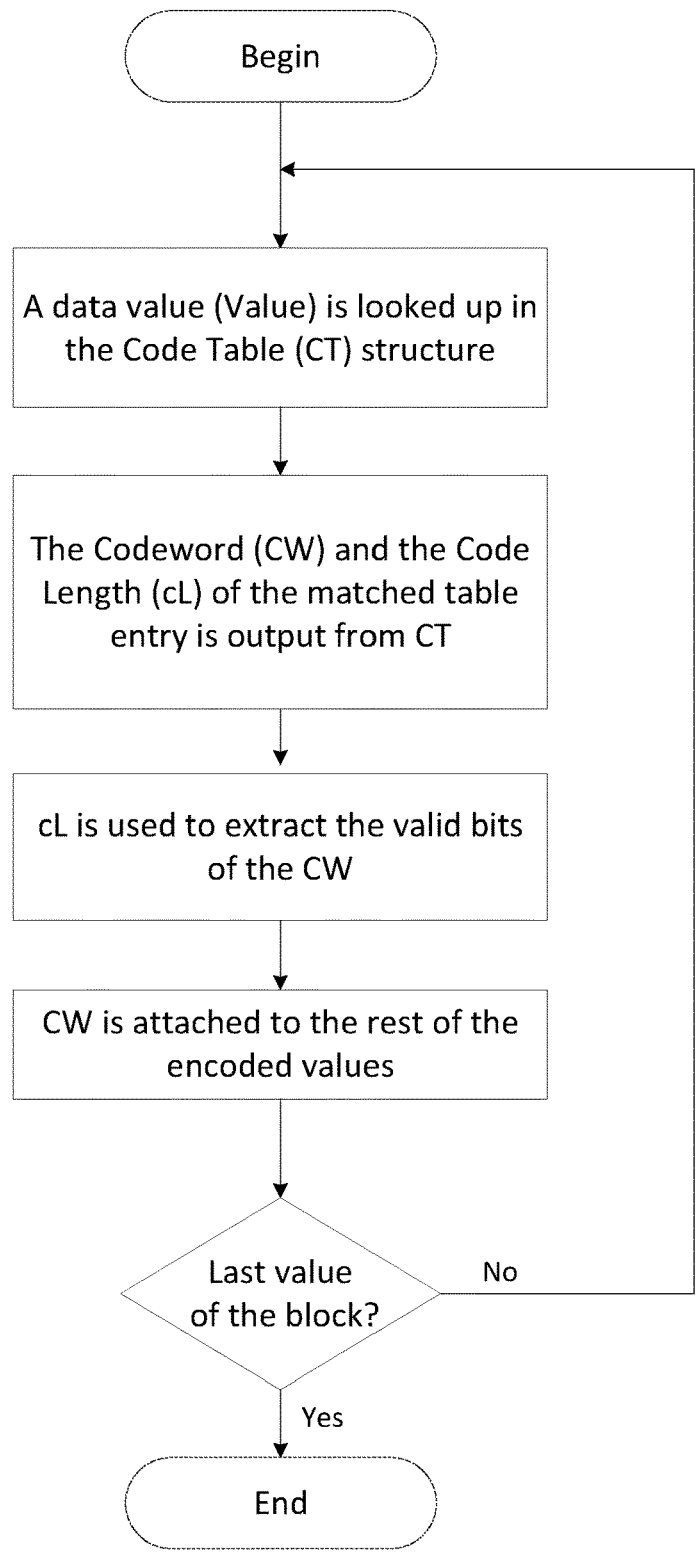
FIG. 11 illustrates an exemplary flow chart of a compression method for compressing a block using variable-length encoding (e.g., Huffman).
Figure 12:
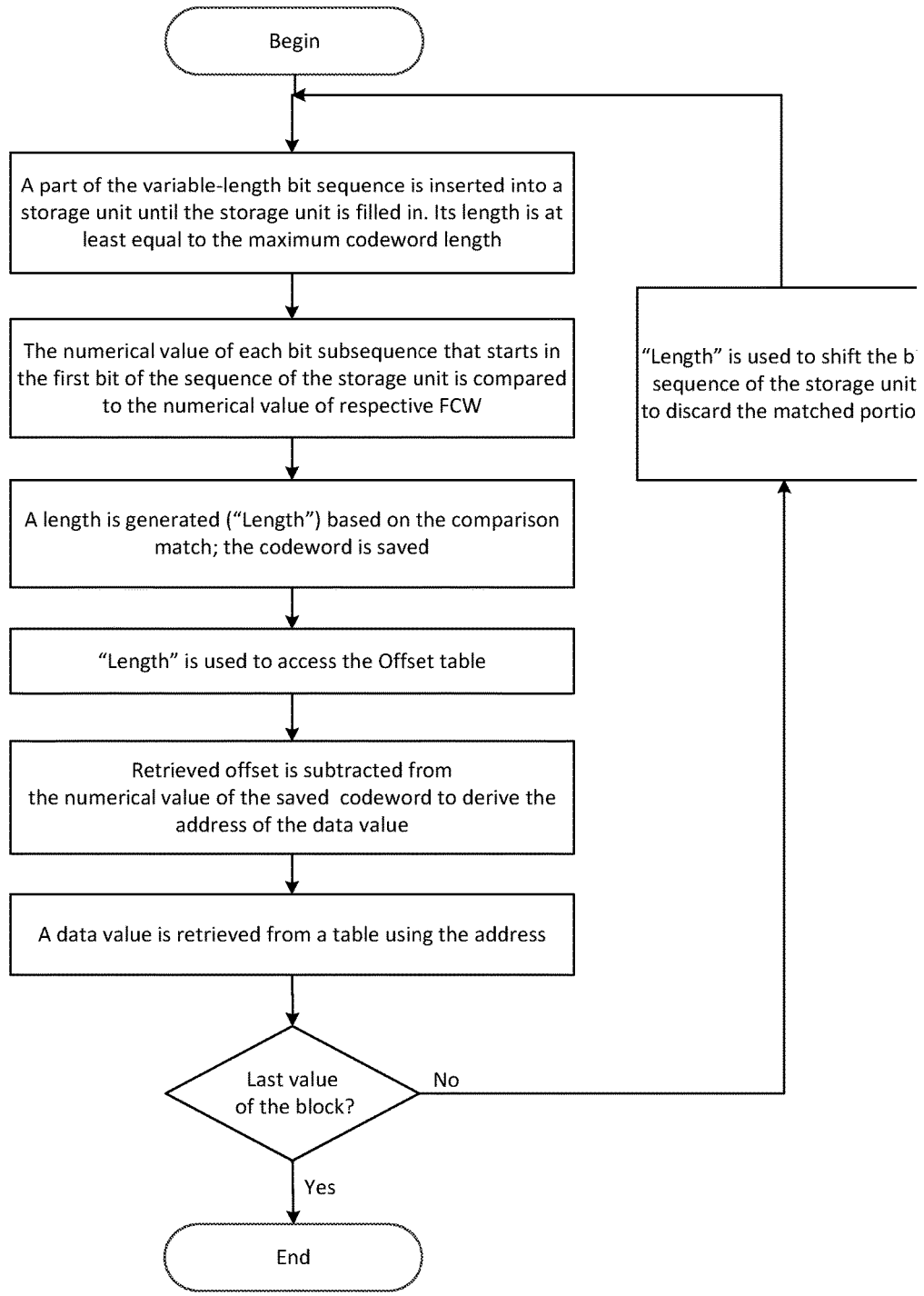
FIG. 12 illustrates an exemplary flow chart of a decompression method for decompressing a compressed block that is compressed using variable-length encoding (e.g., canonical Huffman).

The FP-H data decompression device 2100 of FIG. 21 uses instead a 2-phase decompression process: In Phase-I, the groups of the compressed mH and mL sub-fields are decompressed in parallel and then, in phase-II the group of the compressed exponent is decompressed. The parallel decompression of mH and mL is allowed by saving the group of the compressed mH sub-fields in reverse order in the end of the compressed data set ('Y' points to the first bit of the group of the compressed mH). Decompression for mH and mL is completed after the decompressors 2130*a* and 2130*b* have decompressed 8 values each. At that point, the boundaries of the compressed exponent sub-fields become known, thus decompression can start immediately by the decompressor 2130*c* (Phase-II). The Huffman-based canonical decompressor of FIG. 10 may be used to implement each of the decompressors 2130*a*, 2130*b* and 2130*c*. The data decompression device 2100 of FIG. 21 places the decompressed sub-fields (mL, mH) and the decompressed data field (e) directly in the respective bit positions of a fully decompressed data set, which is kept in the storage unit 2145, so that the decompressed data set 2190 is ready when the last exponent field is decompressed. Hence, the decompressors 2130*a*, 2130*b* and 2130*c* implement a mechanism which generates the decompressed data set 2190, without any separate mechanism for this. An alternative embodiment could instead be designed similarly to the one of FIG. 17, using a separate Reconstructor unit to implement the mechanism which generates the decompressed data set 2190, as is readily realized by someone skilled in the art.

In an alternative embodiment of the FP-H system, the mL group can be selected to be left uncompressed because of the low expected value locality due to the irregularity of the mantissa's least significant bits. This can accelerate decompression by requiring only phase I (parallel decompression of mH and exponents).

It is observed that the exponent field of the values of a data set exhibits high value locality: temporal (i.e., the same value appears often), but also spatial locality (i.e., values are spatially close meaning that they have small value difference when compared to each other). Thereby, alternative embodiments of the FP-H system can be realized, which attempt to compress the exponent using a more lightweight compression algorithm, e.g., delta encoding. In comparison to the aforementioned embodiment of the FP-H system, this can have a small detrimental effect in the compression efficiency; however, decompression can be significantly accelerated in contrast to the inherently sequential decompression of the Huffman-based compressed exponent in the second phase.

In an alternative embodiment of the FP-H system, the exponent can be compressed using a delta-based compressor (the mantissa sub-fields are compressed and decompressed as previously), as the exponent fields of the values of a data set can be typically clustered. Interestingly, delta-based decompression requires only few cycles; this could reduce the latency of the second decompression phase in an alternative FP-H decompressor embodiment. This alternative embodiment system is referred to as FP-H-delta. Two exponent clusters appear frequently per said data set especially when the data set is a block in an example cache subsystem and/or example memory subsystem and/or example data transferring subsystem in an example computer system and/or a data communication system. Two bases are thereby needed in order to be able to represent two exponent clusters. Therefore, the group of compressed exponents comprises three parts: two bases (11 bits each, similar to the width of an uncompressed exponent of a double-precision floating-point value), 8 deltas (of width of 2 bits) and a mask (8×1 bits). The mask defines which base to be used during decompression, while the delta width can be of any arbitrary size depending on the range target to be covered by exponent-cluster. The compressor 2030*a* of the FP-H data compression device 2000 of FIG. 20 and the decompressor 2130*a* of the FP-H data decompression device 2100 of FIG. 21 can be implemented by someone skilled in the art by tuning the respective compressor and decompressor as disclosed in the published paper Gennady Pekhimenko, Vivek Seshadri, Onur Mutlu, Phillip B. Gibbons, Michael A. Kozuch, and Todd C. Mowry, 2012, Base-delta-immediate compression: practical data compression for on-chip caches, in *Proceedings of the* 21*st international conference on Parallel architectures and compilation techniques (PACT '*12).

The compression and decompression units (i.e., compressors and decompressors) of the data compression and decompression devices disclosed herein can be pipelined and/or parallelized by someone skilled in the art, to increase processing throughput and/or reduce compression and decompression latency.

The methods and block diagrams of the disclosed invention and its embodiments can preferably be executed at run-time by any logic circuitry included in or associated with a processor device/processor chip or memory device/memory chip. Further inventive aspects therefore include logic circuitry, a processor device/processor chip and a memory device/memory chip configured to execute the aforesaid methods and block diagrams.

It shall be noticed that other embodiments than the ones explicitly disclosed are equally possible within the scope of the respective invention.

There are generally no particular limitations in the data sizes for any of the entities (e.g. data set, data type, data value, data field, data block, cache block, cache line, data chunks, etc) referred to in this disclosure.

With reference to FIG. 22-FIG. 26, general inventive aspects, generalized over the specific embodiments shown in FIG. 15-FIG. 21, will now be described. Like reference numerals will be used; a reference numeral having the format XXnn in one of the drawings of FIG. 22A-FIG. 26 generally represents a same or at least corresponding element YYnn in any of the other drawings of FIG. 22-FIG. 26 or FIG. 15-FIG. 21.

Figure 22A:
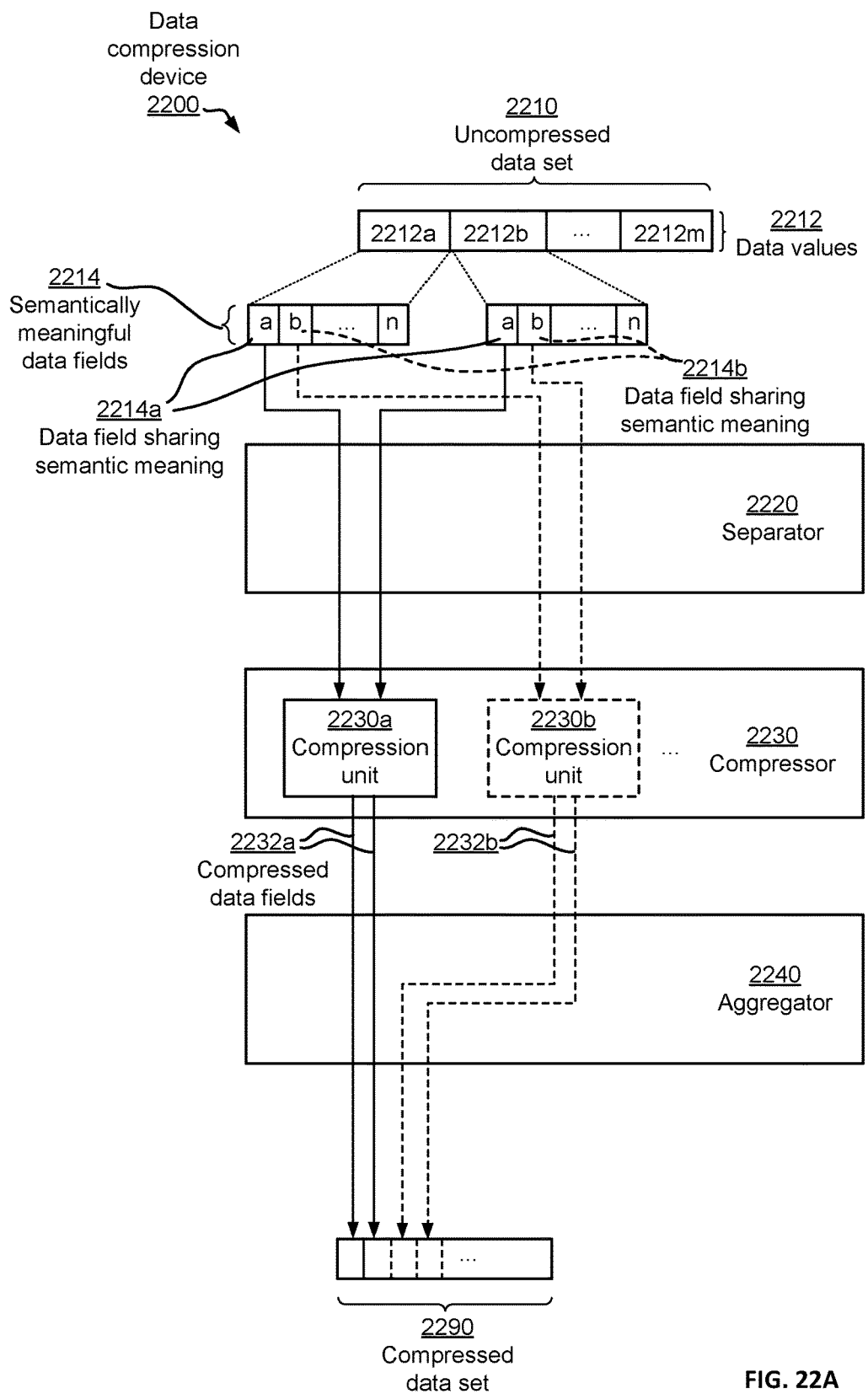
FIG. 22A illustrates a general data compression device according to the invention.

FIG. 22A discloses a data compression device 2200 for compressing an uncompressed data set 2210 into a compressed data set 2290. The uncompressed data set 2210 comprises a plurality of data values 2212*a-m*. The data compression device 2200 comprises a separator 2220 configured to divide each data value in the data set into a plurality of semantically meaningful data fields 2214*a-n*. The separator 2220 may, for instance, be any of the aforementioned Classifier units 1520, 2020.

The data compression device 2200 also comprises a compressor 2230 comprising one or more compression units 2230*a*, 2230*b*, wherein a first compression unit 2230*a* among the compression units is configured to apply, for at least one, 2214*a*, of the semantically meaningful data fields of each data value, a first data compression scheme to that data field 2214*a* in isolation from other ones, 2214*b*, 2214*n*, of the semantically meaningful data fields of the data value, to generate a compressed data field 2232*a*. The data compression units 2230 may, for instance, be any of the aforementioned data compression units or Compressors 1530, 2030.

The data compression device 2200 moreover comprises an aggregator 2240 configured to include the compressed data field in a resulting aggregated compressed data set to generate the compressed data set 2290. The aggregator 2240 may, for instance, be any of the aforementioned Concatenate units 1540, 2040.

The data compression device 2200 offers improved data compression by allowing exploitation of value locality at data field level rather than data value level.

Advantageously, the compressor 2230 of the data compression device 2200 comprises a second compression unit 2230*b* which is configured to apply a second data compression scheme being different from the first data compression scheme of the first compression unit 2230*a* (the compressor 2230 may very well also comprise a third compression unit 2230c which is configured to apply a third data compression scheme, etc).

Advantageously, as is clear from the description of the above embodiments in FIG. 15-FIG. 21, at least one of the first and second data compression schemes is a lossless data compression scheme, such as, for instance, any of the following lossless data compression schemes: statistical compression (such as, for instance, Huffman compression, canonical Huffman compression, arithmetic coding), delta encoding, dictionary-based compression, pattern-based compression, significance-based compression, null-data-set compression.

In alternative embodiments, however, at least one of the first and second data compression schemes is instead a lossy data compression scheme.

The first data compression scheme of the first compression unit 2230a may be adapted to exploit a value locality of the at least one, 2214a, of the semantically meaningful data fields 2214a-n to yield a better compressibility than if the first data compression scheme had been applied to the entire data value 2212a as a whole.

In some embodiments of the data compression device 2200, at least one of the semantically meaningful data fields 2214a-n is not compressed by any of the compression units 2230a, 2230b, but is left uncompressed and is included by the aggregator 2240 in uncompressed form in the generated compressed data set 2290. This is for instance the case for the sign (s) data fields in the embodiment of FIG. 20.

In some embodiments of the data compression device 2200, the aggregator 2240 is configured to maintain the original order of data fields 2214a-n from the uncompressed data set 2210 in the generated compressed data set 2290.

Preferably, however, as is the case for instance for the embodiment of FIG. 15, the separator 2220 of the data compression device 2200 is configured to group together respective first semantically meaningful data fields 2214a from the data values 2212a-m into a first data field group (e.g. group 1525a in FIG. 15) and provide the first data field group to the first compression unit 2230a (e.g. Compressor S 1530a), whereas the separator 2220 is configured to group together respective second semantically meaningful data fields 2214b from the data values 2212a-m into a second data field group (e.g. group 1525b) and provide the second data field group to the second compression unit 2230b (e.g. Compressor C 1530b). The aggregator 2240 (e.g. Concatenate unit 1540) is configured to form a first group (e.g. 1542a) of compressed data fields 2232a from the first compression unit, form a second group (e.g. 1542b of compressed data fields 2232b from the second compression unit, and concatenate the first and second groups in the generated compressed data set 2290. The respective first semantically meaningful data fields 2214a in the first data field group (e.g. 1525a) may share a same semantic meaning, and the respective second semantically meaningful data fields 2214b in the second data field group (e.g. 1525b) may share a same semantic meaning. Such a same semantic meaning may, for instance, be that the respective first or second semantically meaningful data fields 2214a, 2214b in the first or second data field group (e.g. 1525a, 1525b) are of a same data type, or of the same sub-field of a common data type.

Such an embodiment is particularly advantageous since it may accelerate compression (and decompression), as multiple compressors (and decompressors) can be used in parallel and improve the compression efficiency by using different compression algorithms to compress the different groups. Hence, the first and second compression units 2230a-b (e.g. 1530a, 1530b) may be configured to operate in parallel when compressing the data fields in the first and second data field groups (e.g. 1525a, 1525b), respectively.

In embodiments of the data compression device 2200, the data values 2212a-m of the uncompressed data set 2210 are of a standard data type, such as, for instance, any of the following standard data types: integer, floating-point, char, string. It can also be a code instruction or data that follow a specific standard.

Alternatively, in embodiments of the data compression device 2200, the data values 2212a-m of the uncompressed data set 2210 are of an abstract data type, such as, for instance, a data structure type or an object type, or data that follow a specific format, such as video format, audio format, etc. When the abstract data type is a data structure type, it may, for instance, comprise a combination of one or more of the standard data types referred above, as well as boolean and pointer.

Figure 22B:
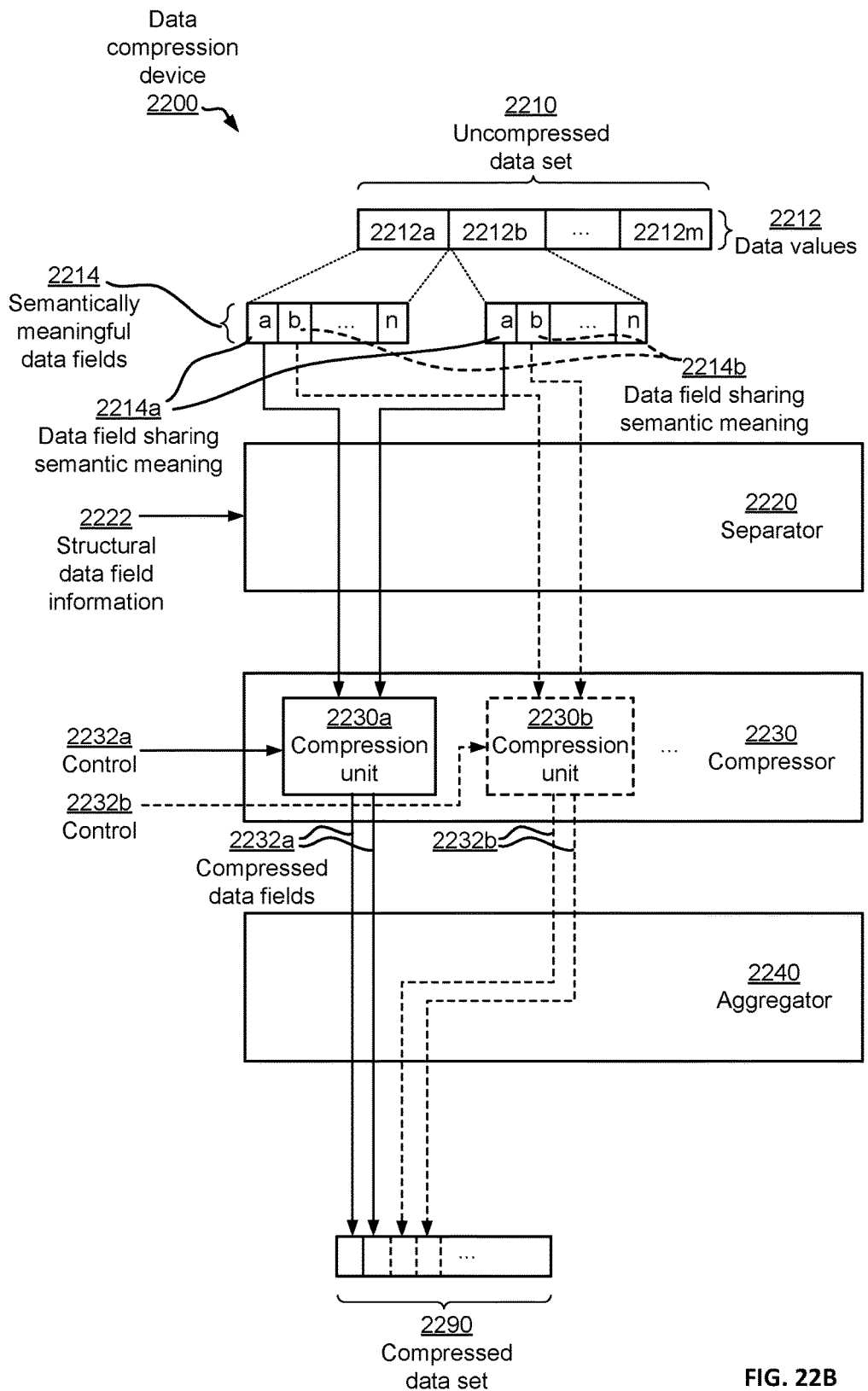
FIG. 22B illustrates a variation of the general data compression device in FIG. 22A.

As seen at 2230a-b in FIG. 22B, the first and second compression units 2230a-b of the data compression device 2200 may be controllable to determine at least one of the following: whether or not the respective compression unit is to perform data compression by applying its respective data compression scheme; and a data compression algorithm for the respective data compression scheme, the data compression algorithm being selectable from a plurality of data compression algorithms. Examples of such control are seen at 1532a-1532c in FIG. 15. The control of the first and second compression units 2230a-b may be based on respective data types of the semantically meaningful data fields 2214a-n.

As seen at 2222 in FIG. 22B, the separator 2220 of the data compression device 2200 may be configured to receive structural data field information about the number and sizes of the semantically meaningful data fields 2214a-n. Such structural data field information may, for instance, be in the form of the information 1522, 1523 for the embodiment in FIG. 15.

In some advantageous embodiments, the data compression device 2200 is used for compressing floating-point numbers. This is the case for instance in the embodiment of FIG. 20. The data values 2212a-m of the uncompressed data set 2210 (e.g. 2010) are hence floating-point numbers, and the semantically meaningful data fields 2214a-n may be sign (s), exponent (e) and mantissa (mH, mL). The exponent (e) and mantissa (mH, mL) data fields may be compressed by respective compression units 2230a-c (e.g. 2030a-c) of the compressor 2230 (e.g. 2030). In some alternatives, like in FIG. 20, the sign (s) data field is left uncompressed and is not compressed by any of the compression units 2230a-c (e.g. 2030a-c) of the compressor 2230 (e.g. 2030).

To further exploit data locality, the separator 2220 of the data compression device 2200 may be configured to further divide at least one of the semantically meaningful data fields 2214a-n into two or more sub-field, wherein at least one of the compressor units is configured to apply, for at least one of the sub-fields, a data compression scheme to that sub-field in isolation from other ones of the sub-fields to generate a compressed sub-field, wherein the aggregator 2240 is configured to include the compressed sub-field in a resulting aggregated compressed data set to generate the compressed data set 2290.

Again, this is the case for instance in the embodiment of FIG. 20. The sub-fields may be mantissa high (mH) and mantissa low (mL), wherein at least one of the mantissa high (mH) and mantissa low (mL) sub-fields is compressed in isolation of the other one of the mantissa high and mantissa low sub-fields. Advantageously, at least the mantissa high (mH) sub-field of the mantissa data field is compressed by statistical compression, wherein the exponent (e) data field is compressed by one of statistical compression, delta encoding or another compression scheme.

In a beneficial embodiment, such as for instance FIG. 20, the mantissa high (mH) and mantissa low (mL) sub-fields of the mantissa data field and the exponent (e) data field are all compressed by respective compression units (2030*c*, 2030*b*, 2030) of the compressor 2230 (2030), and the aggregator 2240 (e.g. 2040) is configured to generate the compressed data set 2290 (2090) by saving therein, in the following order:
  i. a first group (2042-1) comprising sign (s) data fields;
  ii. then a second group (2042-2) comprising compressed mantissa low (mL) sub-fields of the mantissa data field;
  iii. then a third group (2042-3) comprising compressed exponent (e) data fields; and
  iv. then a fourth group (2042-4) comprising compressed mantissa high (mH) sub-fields of the mantissa data field in a reverse order compared to the uncompressed data set (2010).

This arrangement will allow efficient decompression.

Figure 23:
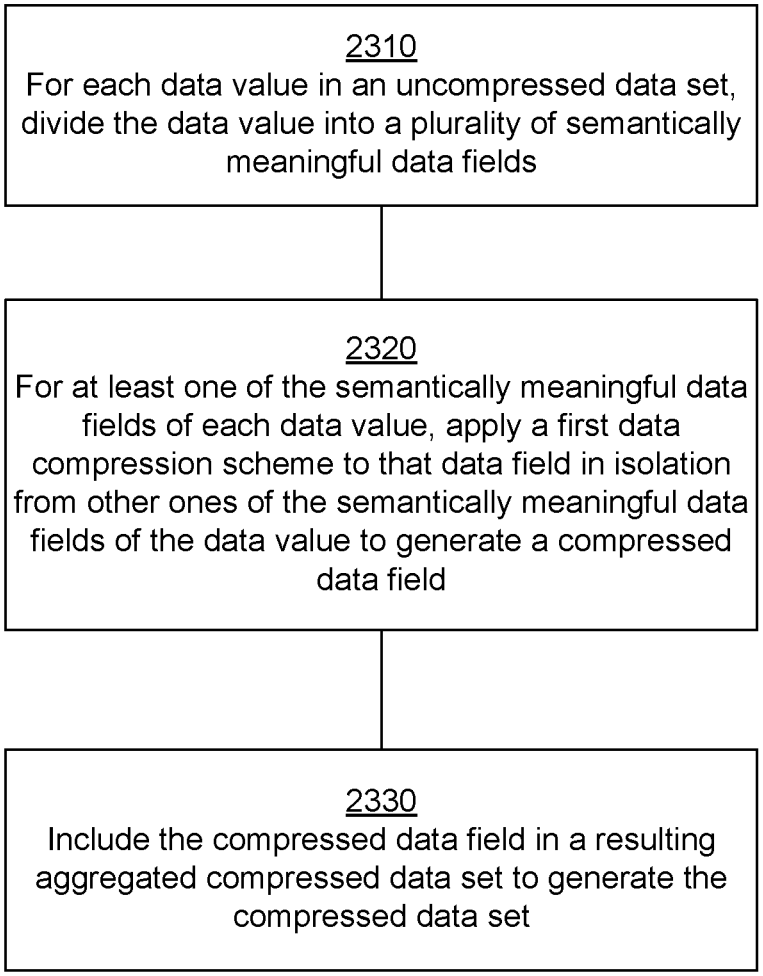
FIG. 23 illustrates a general data compression method according to the invention.

A general inventive data compression method is shown in FIG. 23. In addition to and/or as refinement of the functionality disclosed at 2310-2330 in FIG. 23, this general inventive data compression method may have any or all of the functional features of the various embodiments of the data compression device 2200 as described above.

Figure 24:
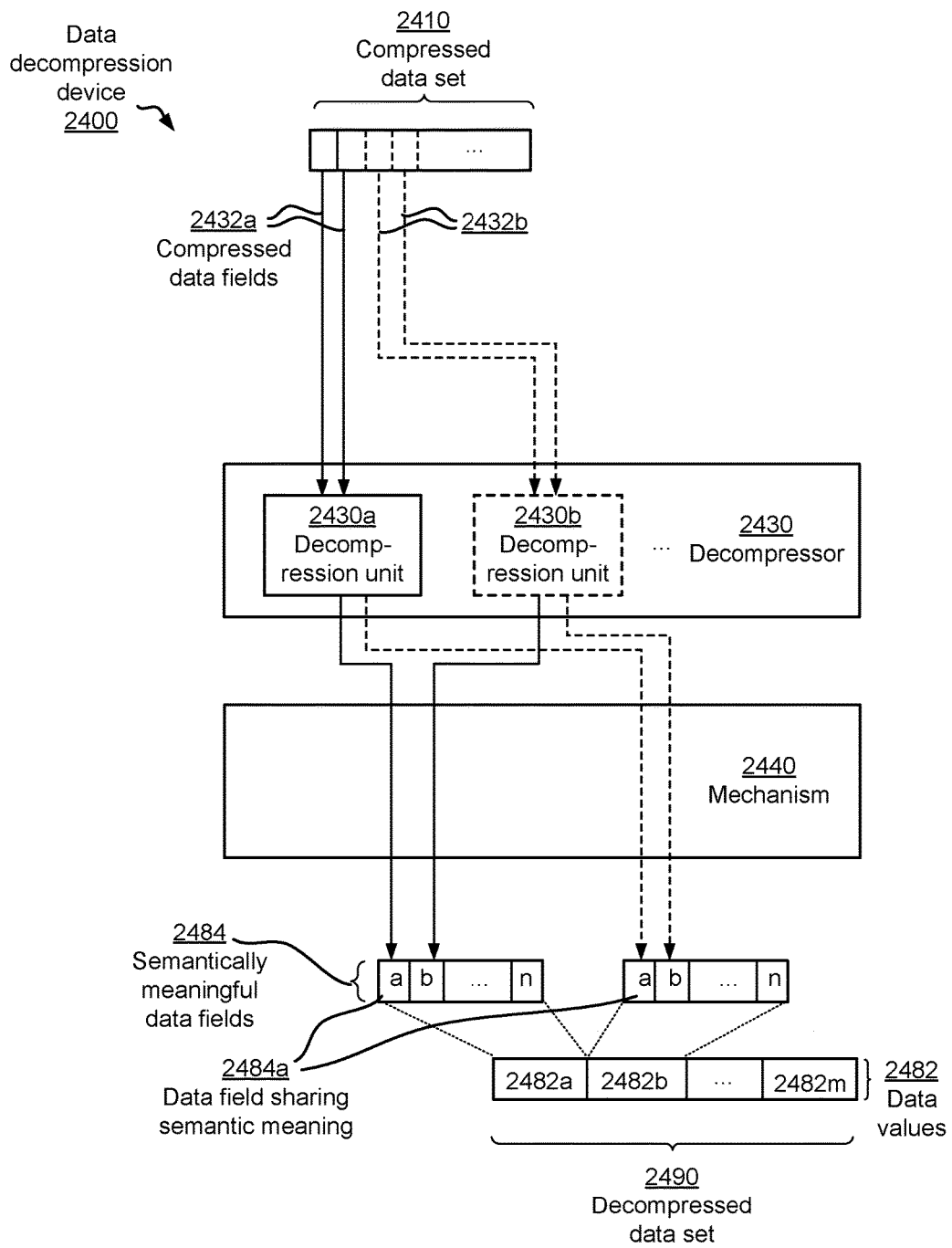
FIG. 24 illustrates a general data decompression device according to the invention.

FIG. 24 discloses a data decompression device 2400 for decompressing a compressed data set 2410 into a decompressed data set 2490. The compressed data set 2410 represents data values 2482 each of which has a plurality of semantically meaningful data fields 2484, at least one of which 2432*a* has been compressed in isolation from other ones of the semantically meaningful data fields. The decompressed data set 2490 may, for instance, have been generated by any of the data compression devices 2200, 1500, 2000 described above. The data decompression device 2400 comprises a decompressor 2430 comprising one or more decompression units 2430*a*, 2430*b*. A first decompression unit 2430*a* among the decompression units is configured to apply, for the at least one 2432*a* compressed data field of each data value, a first data decompression scheme to that compressed data field 2432*a* to generate a decompressed data field (2484*a*). The data decompression units 2430 may, for instance, be any of the aforementioned data decompression units or Decompressors 1730, 2130*a*-2130*c*.

The data decompression device 2400 comprises a mechanism 2440 configured to generate the decompressed data set 2490 by including each decompressed data field 2484*a* in a resulting data value (2482*a*) of the decompressed data set 2490.

Advantageously, the decompressor 2430 of the data decompression device 2400 comprises a second compression unit 2430*b* which is configured to apply a second data decompression scheme being different from the first data decompression scheme of the first decompression unit 2430*a* (the decompressor 2430 may very well also comprise a third compression unit 2430*c* which is configured to apply a third data decompression scheme, etc).

Advantageously, as is clear from the above description, at least one of said first and second data decompression schemes is a lossless data decompression scheme. In alternative embodiments, however, at least one of said first and second data decompression schemes is instead a lossy data decompression scheme.

In some embodiments of the data decompression device 2400, at least one of the data fields 2484 of the compressed data set 2410 is not compressed and is included in uncompressed form in a resulting data value 2482 of the decompressed data set 2490 by the mechanism 2440 configured to generate the decompressed data set.

In some embodiments of the data decompression device 2400, the mechanism 2440 is configured to maintain an order of compressed data fields 2432*a*, 2432*b* from the compressed data set 2410 in the generated decompressed data set 2490.

Advantageously, as is the case for instance for the embodiment of FIG. 17, the decompression units 2430*a* (e.g. 1730*a*-1730*c*) of the decompressor 2430 (e.g. 1730) are configured to receive respective groups (e.g. 1712*a*-1712*c*) of compressed data fields from the compressed data set 2410 (e.g. 1710), decompress the compressed data fields of the respective group, and provide a respective group (e.g. 1735*a*-1735*c*) of decompressed data fields to the mechanism 2440 (e.g. 1740). The mechanism 2440 (e.g. 1740) is configured, for the groups (e.g. 1735*a*-1735*c*) of decompressed data fields as decompressed by the respective decompression units 2430*a*, 2430*b* (e.g. 1730*a*-1730*c*), to reconstruct, in the generated decompressed data set 2490, an original order of the data fields in the data values of an original data set prior to compression.

Such an embodiment is particularly advantageous since it may accelerate decompression, as multiple and decompressors can be used in parallel and improve the decompression efficiency by using different decompression algorithms to decompress the different groups. Hence, the decompression units 2430*a*, 2430*b* (e.g. 1730*a*-1730*c*) of the decompressor 2430 (e.g. 1730) may be configured to operate in parallel.

In embodiments of the data decompression device 2400, the data values 2482 of the decompressed data set 2490 are of a standard data type. Alternatively, the data values 2482 of the decompressed data set 2490 may be of an abstract data type.

The decompression units 2430*a*, 2430*b* (e.g. 1730*a*-1730*c*) of the decompressor 2430 (e.g. 1730) may be controllable to determine at least one of the following: whether or not the respective decompression unit is to perform data decompression by applying its respective data decompression scheme; and a data decompression algorithm for the respective data decompression scheme, the data decompression algorithm being selectable from a plurality of data decompression algorithms. Examples of such control are seen at 1732*a*-1732*c* in FIG. 17. The control of the first and second decompression units 2430*a*-*b* (e.g. 1730*a*-1730*c*) may be based on respective data types of the semantically meaningful data fields 2484.

The mechanism 2440 of the data decompression device 2400 may be configured to receive structural data field information (e.g. 1742, 1743 in FIG. 17) about the number and sizes of the semantically meaningful data fields 2484.

In some advantageous embodiments, the data decompression device 2400 is used for compressing floating-point numbers. This is the case for instance in the embodiment of FIG. 21. The data values 2482 of the decompressed data set 2490 are hence floating-point numbers, and the semantically meaningful data fields 2484 may be sign (s), exponent (e) and mantissa (mH, mL). The compressed exponent (e) and mantissa (mH, mL) data fields 2432*a*, 2432*b* of the compressed data set 2410 (e.g. 2110) may be decompressed by respective decompression units 2430a, 2430b (e.g. 2130a-2130c) of the decompressor 2430. In some alternatives, like in FIG. 21, the sign (s) data field of the compressed data set 2410 (e.g. 2110) is uncompressed and is not decompressed by any of the decompression units 2430a, 2430b (e.g. 2130a-2130c) of the decompressor 2430.

As has been described for the data compression device of FIG. 20, the compressed data set 2410 may comprise at least one compressed sub-field (mH, mL) of a semantically meaningful data field. Accordingly, as is the case with the data decompression device 2100 of FIG. 21, the at least one (e.g. 2130a) of the decompressor units 2400 (e.g. 2130a, 2130b) may be configured to apply a data decompression scheme to said at least one sub-field (mL) to generate a decompressed sub-field, and the mechanism 2440 (e.g. 2130a) may be configured to include the decompressed sub-field in a resulting data value of the decompressed data set 2490.

Again, this is the case for instance in the embodiment of FIG. 21. The sub-fields may be mantissa high (mH) and mantissa low (mL), wherein at least one of the mantissa high (mH) and mantissa low (mL) sub-fields is decompressed in isolation of the other one of the mantissa high and mantissa low sub-fields. Advantageously, at least the mantissa high (mH) sub-field of the mantissa data field is decompressed by statistical decompression, and wherein the exponent (e) data field is decompressed by one of statistical decompression, delta decoding or another decompression scheme.

In a beneficial embodiment, such as for instance FIG. 21, the compressed data set 2210 (e.g. 2110) comprises, in the following order:
i. a first group comprising sign (s) data fields,
ii. then a second group comprising compressed mantissa low (mL) sub-fields of the mantissa data field,
iii. then a third group comprising compressed exponent (e) data fields, and
iv. then a fourth group comprising compressed mantissa high (mH) sub-fields of the mantissa data field in a reverse order compared to an original order in the data values of an original data set prior to compression.

For this embodiment, the decompressor 2430 may have a two-phase operation architecture where:
in a first phase, the mantissa high (mH) and mantissa low (mL) sub-fields of the mantissa data field are decompressed in parallel by statistical decompression by first and second decompression units (e.g. 2130a, 2130b) of the decompressor 2430, and
in a second phase, the exponent (e) data field is decompressed by statistical decompression, delta decoding or another decompression scheme by a third decompression unit (e.g. 2130c) of the decompressor 2430.

This arrangement will allow efficient decompression.

Advantageously, the first, second and third decompression units (e.g. 2130a, 2130b, 2130c) are configured to directly place the respective decompressed mantissa high (mH) and mantissa low (mL) sub-fields and the decompressed exponent (e) data field in the decompressed data set 2490 (e.g. 2190), thereby implementing said mechanism 2440 and eliminating the need for a separate mechanism (like a Reconstructor unit 1740 in FIG. 17).

Figure 25:
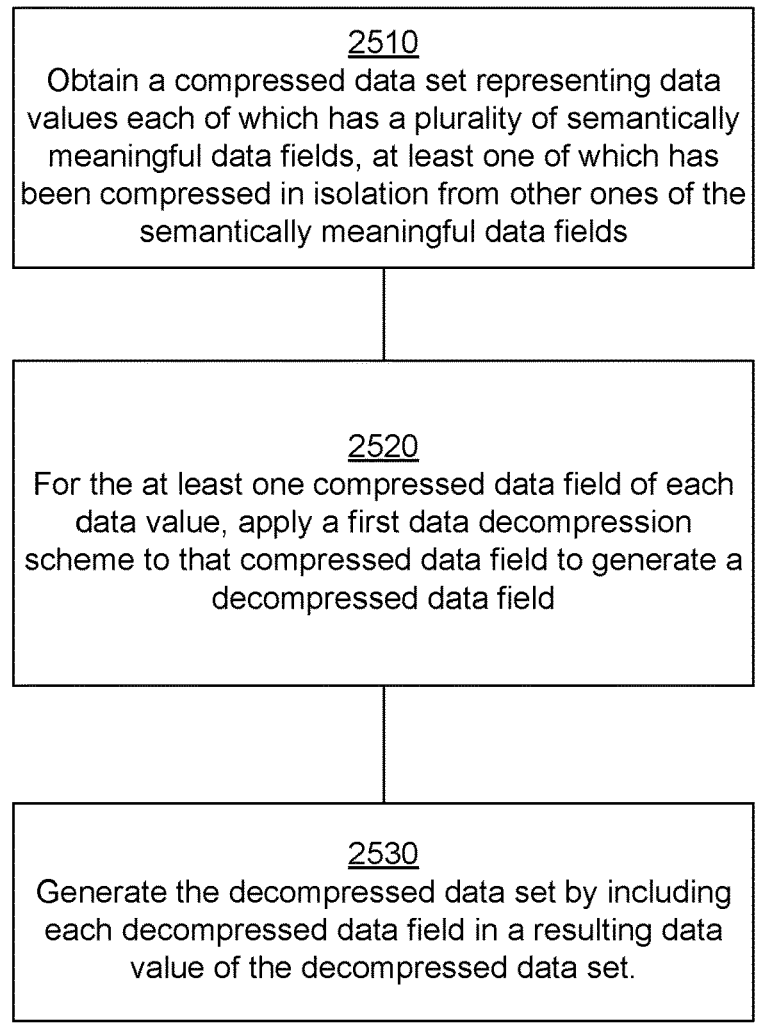
FIG. 25 illustrates a general data decompression method according to the invention.

A general inventive data decompression method is shown in FIG. 25. In addition to and/or as refinement of the functionality disclosed at 2510-2530 in FIG. 25, this general inventive data decompression method may have any or all of the functional features of the various embodiments of the data decompression device 2400 as described above.

The respective data compression devices disclosed herein may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), or other logic circuitry, etc. The functionality of the respective data compression methods described herein may for instance be performed by any of the respective data compression devices being appropriately configured, or generally by a device comprising logic circuitry (included in or associated with for instance a processor device/processor chip or memory device/memory chip) configured to perform the respective data compression methods, or alternatively by respective computer program products comprising code instructions which, when loaded and executed by a general-purpose processing device such as a CPU or DSP (for instance any of the processing units P1 . . . Pn of FIGS. 1-5), cause performance of the respective methods.

The respective data decompression devices disclosed herein may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), or other logic circuitry, etc. The functionality of the respective data decompression methods described herein may for instance be performed by any of the respective data decompression devices being appropriately configured, or generally by a device comprising logic circuitry (included in or associated with for instance a processor device/processor chip or memory device/memory chip) configured to perform the respective data decompression methods, or alternatively by respective computer program products comprising code instructions which, when loaded and executed by a general-purpose processing device such as a CPU or DSP (for instance any of the processing units P1 . . . Pn of FIGS. 1-5), cause performance of the respective methods.

Figure 7:
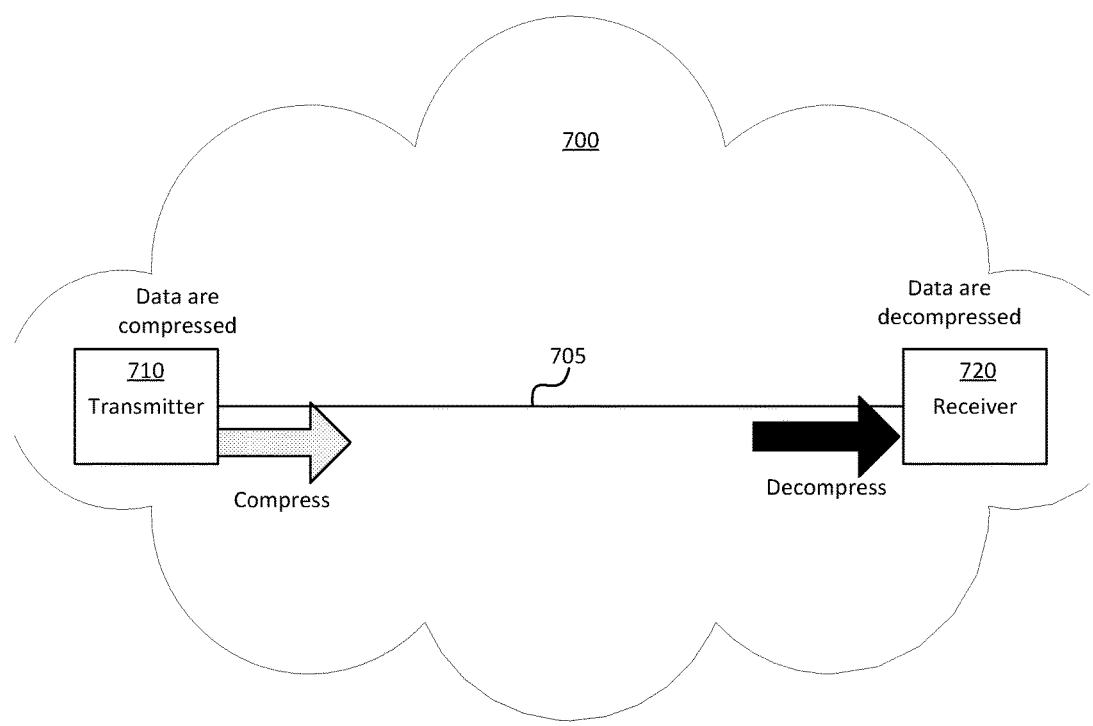
FIG. 7 illustrates a block diagram of the data transmission link of FIG. 6 where the data transferred are in compressed form so they may need to be compressed in the transmitter and decompressed in the receiver.
Figure 8:
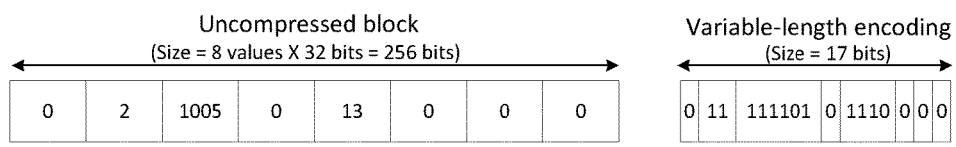
FIG. 8 illustrates on the left an uncompressed block of data values and, on the right, the same block in compressed form using variable-length encoding that has been generated using Huffman coding. All the data values of the uncompressed block are replaced by the respective Huffman codewords.
Figure 26:
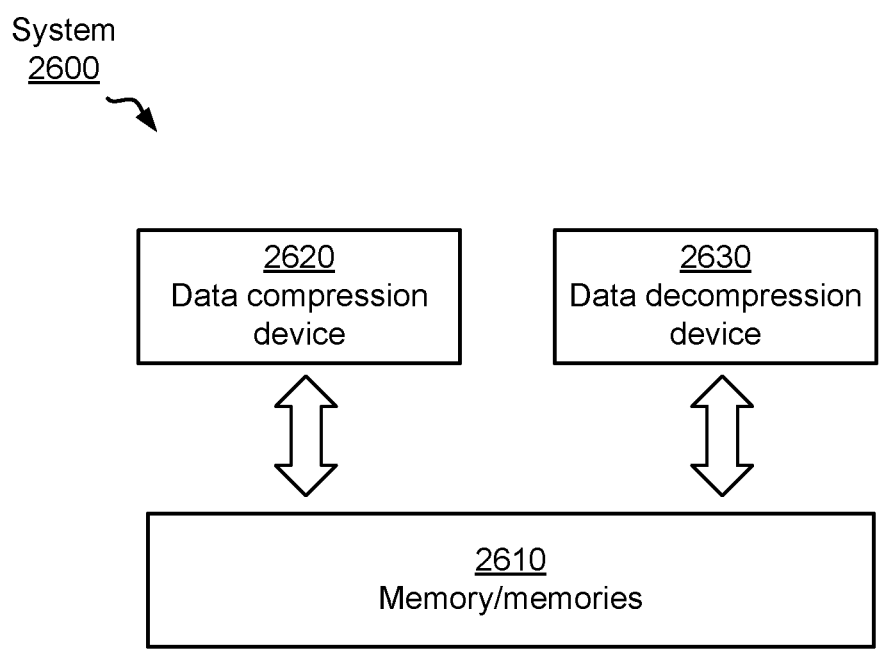
FIG. 26 illustrates a general system comprising a data compression device and a data decompression device according to the invention.

FIG. 26 illustrates a general system 2600 according to the invention. The system comprises one or more memories 2610, a data compression device 2620 (such as, for instance, any of the data compression devices 1500; 2000; 2200) and a data decompression device 2630 (such as, for instance, any of the data decompression devices 1700; 2100; 2400). Advantageously, the system 2600 is a computer system (such as any of the computer systems 100-500 of FIGS. 1-5), and said one or more memories 2610 is/are cache memory/memories (such as any of the cache memories L1-L3 of FIGS. 1-5), random access memory/memories (such as any of the memories 130-530 of FIGS. 1-5), or secondary storage/storages. Alternatively, the system 2600 is a data communication system (such as the communication networks 600, 700 of FIGS. 6-7), wherein said one or more memories 2610 may be data buffers associated with transmitting and receiving nodes in the data communication system (such as transmitter 610, 710 and receiver 620, 720 of FIGS. 6-7).

The invention claimed is:

1. A data compression device for compressing an uncompressed data set into a compressed data set, the uncompressed data set comprising a plurality of data values, the data compression device comprising:
a separator configured to divide each data value in the data set into a plurality of semantically meaningful data fields;
a compressor comprising one or more compression units, wherein a first compression unit among said compression units is configured to apply, for at least one of the semantically meaningful data fields of each data value, a first data compression scheme to that data field in isolation from other ones of the semantically meaningful data fields of the data value to generate a compressed data field; and an aggregator configured to include the compressed data field in a resulting aggregated compressed data set to generate the compressed data set.

2. The data compression device as defined in claim 1, wherein the compressor comprises a second compression unit which is configured to apply a second data compression scheme being different from the first data compression scheme of the first compression unit.

3. The data compression device as defined in claim 2, wherein the separator is configured to group together respective first semantically meaningful data fields from the data values into a first data field group and provide the first data field group to the first compression unit;

the separator is configured to group together respective second semantically meaningful data fields from the data values into a second data field group and provide the second data field group to the second compression unit; and the aggregator is configured to form a first group of compressed data fields from the first compression unit, form a second group of compressed data fields from the second compression unit, and concatenate the first and second groups in the generated compressed data set.

4. The data compression device as defined in claim 2, wherein the first and second compression units are controllable, based on respective data types of the semantically meaningful data fields to determine at least one of the following:

whether or not the respective compression unit is to perform data compression by applying its respective data compression scheme; and a data compression algorithm for the respective data compression scheme, the data compression algorithm being selectable from a plurality of data compression algorithms.

5. The data compression device as defined in claim 3, wherein the first and second compression units are configured to operate in parallel when compressing the data fields in the first and second data field groups, respectively, and wherein the respective first semantically meaningful data fields in the first data field group share a same semantic meaning, and wherein the respective second semantically meaningful data fields in the second data field group share a same semantic meaning.

6. The data compression device as defined in claim 1, wherein at least one of the semantically meaningful data fields is not compressed by any of the compression units, but is left uncompressed and is included in uncompressed form by the aggregator in the generated compressed data set.

7. The data compression device as defined in claim 1, wherein the aggregator is configured to maintain the original order of data fields from the uncompressed data set in the generated compressed data set.

8. The data compression device as defined in claim 1, wherein the first data compression scheme of the first compression unit is adapted to exploit a value locality of said at least one of the semantically meaningful data fields to yield a better compressibility than if the first data compression scheme had been applied to the entire data value as a whole.

9. The data compression device as defined in claim 1, wherein the data values of the uncompressed data set are of a standard data type, or of an abstract data type.

10. The data compression device as defined in claim 1, wherein the separator is configured to receive structural data field information about the number and sizes of the semantically meaningful data fields.

11. The data compression device as defined in claim 1,
wherein the separator is configured to further divide at least one of the semantically meaningful data fields into two or more sub-fields;

wherein at least one of the compressor units is configured to apply, for at least one of the sub-fields, a data compression scheme to that sub-field in isolation from other ones of the sub-fields to generate a compressed sub-field; and wherein the aggregator is configured to include the compressed sub-field in a resulting aggregated compressed data set to generate the compressed data set.

12. The data compression device as defined in claim 11,
wherein the data values of the uncompressed data set are floating-point numbers, wherein the semantically meaningful data fields are sign, exponent and mantissa, and wherein the sub-fields are mantissa high and mantissa low, and wherein at least one of the mantissa high and mantissa low sub-fields is compressed in isolation of the other one of the mantissa high and mantissa low sub-fields.

13. The data compression device as defined in claim 12, wherein at least the mantissa high sub-field of the mantissa data field is compressed by statistical compression, and wherein the exponent data field is compressed by one of statistical compression, delta encoding or another compression scheme;

wherein the mantissa high and mantissa low sub-fields of the mantissa data field and the exponent data field are compressed by respective compression units of the compressor, and wherein the aggregator is configured to generate the compressed data set by saving therein, in the following order:

a first group comprising sign data fields;

then a second group comprising compressed mantissa low sub-fields of the mantissa data field;

then a third group comprising compressed exponent data fields; and then a fourth group comprising compressed mantissa high sub-fields of the mantissa data field in a reverse order compared to the uncompressed data set.

14. The data compression device as defined in claim 1, wherein the data values of the uncompressed data set are floating-point numbers and wherein the semantically meaningful data fields are sign, exponent and mantissa.

15. The data compression device as defined in claim 14, wherein the exponent and mantissa data fields are compressed by respective compression units of the compressor.

16. A data compression method for compressing an uncompressed data set into a compressed data set, the uncompressed data set comprising a plurality of data values, the data compression method comprising:

for each data value in the data set, dividing the data value into a plurality of semantically meaningful data fields;

for at least one of the semantically meaningful data fields of each data value, applying a first data compression scheme to that data field in isolation from other ones of the semantically meaningful data fields of the data value to generate a compressed data field; and including the compressed data field in a resulting aggregated compressed data set to generate the compressed data set.

17. A non-transitory computer-readable storage medium encoded with data and instructions which, when executed by a computing device, cause the computing device to perform the method according to claim 16.

18. A device comprising logic circuitry configured to perform the method according to claim 16.

19. A data decompression method for decompressing a compressed data set into a decompressed data set, the compressed data set representing data values each of which has a plurality of semantically meaningful data fields, at least one of which has been compressed in isolation from other ones of the semantically meaningful data fields, the data decompression method comprising:
for said at least one compressed data field of each data value, applying a first data decompression scheme to that compressed data field to generate a decompressed data field; and
generating the decompressed data set by including each decompressed data field in a resulting data value of the decompressed data set.

20. A non-transitory computer-readable storage medium encoded with data and instructions which, when executed by a computing device, cause the computing device to perform the method according to claim 19.

21. A device comprising logic circuitry configured to perform the method according to claim 19.

22. A data decompression device for decompressing a compressed data set into a decompressed data set, the compressed data set representing data values each of which has a plurality of semantically meaningful data fields, at least one of which has been compressed in isolation from other ones of the semantically meaningful data fields, the data decompression device comprising:
a decompressor comprising one or more decompression units, wherein a first decompression unit among said decompression units is configured to apply, for said at least one compressed data field of each data value, a first data decompression scheme to that compressed data field to generate a decompressed data field; and
a mechanism configured to generate the decompressed data set by including each decompressed data field in a resulting data value of the decompressed data set.

23. The data decompression device as defined in claim 22,
wherein the compressed data set comprises at least one compressed sub-field of a semantically meaningful data field;
wherein at least one of the decompressor units is configured to apply a data decompression scheme to said at least one sub-field to generate a decompressed sub-field; and
wherein the mechanism is configured to include the decompressed sub-field in a resulting data value of the decompressed data set.

24. The data decompression device as defined in claim 23,
wherein the data values of the decompressed data set are floating-point numbers,
wherein the semantically meaningful data fields are sign, exponent and mantissa, and
wherein the sub-fields are mantissa high and mantissa low, and wherein at least one of the mantissa high and mantissa low sub-fields is decompressed in isolation of the other one of the mantissa high and mantissa low sub-fields.

25. The data decompression device as defined in claim 24,
wherein at least the mantissa high sub-field of the mantissa data field is decompressed by statistical decompression, and wherein the exponent data field is decompressed by one of statistical decompression, delta decoding or another decompression scheme;
wherein the compressed data set comprises, in the following order:
i. a first group comprising sign data fields,
ii. then a second group comprising compressed mantissa low sub-fields of the mantissa data field,
iii. then a third group comprising compressed exponent data fields, and
iv. then a fourth group comprising compressed mantissa high sub-fields of the mantissa data field in a reverse order compared to an original order in the data values of an original data set prior to compression; and
wherein the decompressor has a two-phase operation architecture where:
in a first phase, the mantissa high and mantissa low sub-fields of the mantissa data field are decompressed in parallel by statistical decompression by first and second decompression units of the decompressor, and
in a second phase, the exponent data field is decompressed by statistical decompression, delta decoding or another decompression scheme by a third decompression unit of the decompressor.

26. The data decompression device as defined in claim 25, wherein the first, second and third decompression units are configured to directly place the respective decompressed mantissa high and mantissa low sub-fields and the decompressed exponent data field in the decompressed data set, thereby implementing said mechanism.

27. The data decompression device as defined in claim 22, wherein the decompressor comprises a second compression unit which is configured to apply a second data decompression scheme being different from the first data decompression scheme of the first decompression unit.

28. The data decompression device as defined in claim 22, wherein the mechanism is configured to receive structural data field information about the number and sizes of the semantically meaningful data fields.

29. The data decompression device as defined in claim 22, wherein the decompression units of the decompressor are controllable, based on respective data types of the semantically meaningful data fields to determine at least one of the following:
whether or not the respective decompression unit is to perform data decompression by applying its respective data decompression scheme; and
a data decompression algorithm for the respective data decompression scheme, the data decompression algorithm being selectable from a plurality of data decompression algorithms.

30. The data decompression device as defined in claim 22, wherein at least one of the data fields of the compressed data set is not compressed and is included in uncompressed form in a resulting data value of the decompressed data set by the mechanism configured to generate the decompressed data set.

31. The data decompression device as defined in claim 22, wherein the mechanism is configured to maintain an order of compressed data fields from the compressed data set in the generated decompressed data set.

32. The data compression device as defined in claim 22,
wherein the decompression units of the decompressor are configured to receive respective groups of compressed data fields from the compressed data set, decompress the compressed data fields of the respective group, and provide a respective group of decompressed data fields to the mechanism; and wherein the mechanism is configured, for the groups of decompressed data fields as decompressed by the respective decompression units, to reconstruct, in the generated decompressed data set, an original order of the data fields in the data values of an original data set prior to compression.

33. The data decompression device as defined in claim 22, wherein the decompression units of the decompressor are configured to operate in parallel.

34. The data decompression device as defined in claim 22, wherein the data values of the decompressed data set are of a standard data type, or of an abstract data type.

35. A system comprising one or more memories, a data compression device according to claim 1 and a data decompression device according to claim 22.

36. The system as defined in claim 35, wherein the system is a computer system and wherein said one or more memories are from the group consisting of:
cache memories,
random access memories, and
secondary storages.

37. The system as defined in claim 35, wherein the system is a data communication system and wherein said one or more memories are data buffers.

38. The data decompression device as defined in claim 22, wherein the data values of the decompressed data set are floating-point numbers and wherein the semantically meaningful data fields are sign, exponent and mantissa.

39. The data decompression device as defined in claim 38, wherein compressed exponent and mantissa data fields of the compressed data set are decompressed by respective decompression units of the decompressor.

* * * * *